(12) United States Patent
Elkholy

(10) Patent No.: US 10,895,850 B1
(45) Date of Patent: Jan. 19, 2021

(54) MIXED-DOMAIN CIRCUIT WITH DIFFERENTIAL DOMAIN-CONVERTERS

(71) Applicant: Si-Ware Systems S.A.E., Cairo (EG)

(72) Inventor: Ahmed Elkholy, Irvine, CA (US)

(73) Assignee: Si-Ware Systems S.A.E., Cairo (EG)

( * ) Notice: Subject to any disclaimer, the term of this patent is extended or adjusted under 35 U.S.C. 154(b) by 0 days.

(21) Appl. No.: 16/938,363

(22) Filed: Jul. 24, 2020

Related U.S. Application Data

(60) Provisional application No. 62/878,735, filed on Jul. 25, 2019.

(51) Int. Cl.
| | | |
|---|---|---|
| *H03M 3/00* | (2006.01) | |
| *G04F 10/00* | (2006.01) | |
| *H03M 1/34* | (2006.01) | |
| *H03L 7/197* | (2006.01) | |
| *H03L 7/099* | (2006.01) | |
| *H03L 7/093* | (2006.01) | |

(52) U.S. Cl.
CPC ............ *G04F 10/005* (2013.01); *H03M 1/34* (2013.01); *H03M 3/358* (2013.01); *H03M 3/368* (2013.01); *H03L 7/093* (2013.01); *H03L 7/0991* (2013.01); *H03L 7/1976* (2013.01)

(58) Field of Classification Search
CPC ..... H03M 3/358; H03M 3/368; H03L 7/1976; H03L 7/093; H03L 7/0991
USPC ........................................................ 341/143
See application file for complete search history.

(56) References Cited

U.S. PATENT DOCUMENTS

| | | |
|---|---|---|
| 8,970,421 B1 | 3/2015 | Gao et al. |
| 9,264,211 B1 | 2/2016 | Jenkins |
| 9,344,271 B1 | 5/2016 | Dusatko |
| 9,362,936 B1 | 6/2016 | Caffee |
| 9,490,818 B2 | 11/2016 | Perrott |
| 2014/0097875 A1 | 4/2014 | Tertinek et al. |

(Continued)

OTHER PUBLICATIONS

A. Elkholy, S. Saxena, G. Shu, A. Elshazly and P. K. Hanumolu, "Low-Jitter Multi-Output All-Digital Clock Generator Using DTC-Based Open Loop Fractional Dividers", IEEE Journal of Solid-State Circuits, vol. 53, No. 6, pp. 1806-1817, Jun. 2018.

(Continued)

*Primary Examiner* — Joseph J Lauture
(74) *Attorney, Agent, or Firm* — gPatent LLC; Stuart T. Auvinen

(57) ABSTRACT

A mixed-domain circuit has a differential pair of Digital-to-Time Converters (DTCs), one receiving a reference clock and the other receiving a feedback clock. A Time-to-Digital Converter (TDC) compares outputs from the differential pair of DTCs and generates a digital error value that controls a digital loop filter that controls a Digitally-Controlled Oscillator (DCO) that generates an output clock. A Multi-Modulus Divider (MMD) generates the feedback clock. An accumulated modulation from a delta-sigma modulator is compared to the digital error value by a Least-Mean Square (LMS) correlator to adjust supply voltage or current sources in the pair of DTCs to compensate for errors. A capacitor in each DTC has a charging time adjusted by the accumulated modulation. The DTC can be reduced to a Time-to-Voltage Converter (TVC) and the analog voltages on the capacitors input to an Analog-to-Digital Converter (ADC) to generate the digital error value.

20 Claims, 17 Drawing Sheets

(56) References Cited

U.S. PATENT DOCUMENTS

2020/0192301 A1* 6/2020 Khoury .................. H03L 7/085

OTHER PUBLICATIONS

J. Z. Ru, C. Palattella, P. Geraedts, E. Klumperink and B. Nauta, "A High-Linearity Digital-to-Time Converter Technique: Constant-Slope Charging", IEEE Journal of Solid-State Circuits, vol. 50, No. 6, pp. 1412-1423, Jun. 2015.

L. Vercesi and L. Fanori and F. De Bernardinis and A. Liscidini and R. Castello, "A Dither-Less All Digital PLL for Cellular Transmitters", IEEE Journal of Solid-State Circuits, vol. 47, No. 8, pp. 1908-1920, Aug. 2012.

C.-M. Hsu, M. Z. Straayer, and M. H. Perrott, "A low-noise wide-BW 3.6-GHz digital ΔΣ fractional-N frequency synthesizer with a noise-shaping time-to-digital converter and quantization noise cancellation", IEEE J. Solid-State Circuits, vol. 43, No. 12, pp. 2776-2786, Dec. 2008.

D. Tasca, M. Zanuso, G. Marzin, S. Levantino, C. Samori, and A. L. Lacaita, "A 2.9-4.0-GHz fractional-N digital PLL with bang-bang phase detector and 560-fs rms integrated jitter at 4.5-mW power", IEEE J. Solid-State Circuits, vol. 46, No. 12, pp. 2745-2758, Dec. 2011.

A. Elkholy, T. Anand, W. S. Choi, A. Elshazly, and P. K. Hanumolu, "A 3.7 mW low-noise wide-bandwidth 4.5 GHz digital fractional-N PLL using time amplifier-based TDC", IEEE J. Solid-State Circuits, vol. 50, No. 4, pp. 867-881, Apr. 2015.

M. Zanuso, S. Levantino, C. Samori and A. L. Lacaita, "A Wideband 3.6 GHz Digital ΔΣ Fractional-N PLL With Phase Interpolation Divider and Digital Spur Cancellation", IEEE Journal of Solid-State Circuits, vol. 46, No. 3, pp. 627-638, Mar. 2011.

M. Lee, M. E. Heidari, and A. A. Abidi, "A low-noise wideband digital phase-locked loop based on a coarse-fine time-to-digital converter with subpicosecond resolution", IEEE J. Solid-State Circuits, vol. 44, No. 10, pp. 2808-2816, Oct. 2009.

V. Hariprasath, J. Guerber, S.-. Lee and U.-. Moon, "Merged capacitor switching based SAR ADC with highest switching energy-efficiency", Electronics Letters, vol. 46, No. 9, pp. 620-621, Apr. 29, 2010.

* cited by examiner

US 10,895,850 B1

MIXED-DOMAIN CIRCUIT WITH DIFFERENTIAL DOMAIN-CONVERTERS

RELATED APPLICATION

This application claims the benefit of provisional application U.S. Ser. No. 62/878,735, filed Jul. 25, 2019, hereby incorporated by reference. This application is also related to "Adaptive Nonlinearity Identification and Compensation Using Orthogonal Functions in a Mixed Signal Circuit", U.S. Pat. No. 10,594,329, filed Dec. 7, 2018, hereby incorporated by reference.

FIELD OF THE INVENTION

This invention relates to mixed-domain Integrated Circuits (ICs) and more particularly to clock generators, frequency synthesizers, and time-based data converters.

BACKGROUND OF THE INVENTION

With the advent of the age of big data and the wide adaption of the internet of things, data bandwidth requirements have seen an explosive growth. This substantially increased the complexity of modern wireline and wireless communication systems, where spectrally efficient complex modulation schemes are being employed. It poses stringent performance requirements to achieve the required high Signal-to-Noise Ratio (SNR) in an energy-efficient manner. These modern wireline and wireless communication systems need clock and frequency synthesizers that exhibit ultra-low phase noise and spurious performance with low power consumption. In these applications, Fractional-N Phase-Locked Loops (FN-PLLs) are highly desirable, in contrast to integer-N PLLs, as they offer flexibility in frequency planning using only a single crystal reference clock.

A FN-PLL generates an output clock signal, OUT, of frequency $F_{OUT}=(N_{DIV}+\alpha_{DIV})F_{REF}$, where $N_{DIV}$ is a positive integer, $\alpha_{DIV}$ is a fractional value between 0 and 1, and $F_{REF}$ is the frequency of a reference clock signal REF. Fractional-N operation is achieved by dithering the feedback Multi-Modulus Divider (MMD). To realize very fine frequency synthesis capability (in the order of 20-bits), delta sigma ($\Delta\Sigma$) modulation techniques are typically employed to dither the feedback divider by leveraging a high oversampling ratio and noise shaping techniques. The large amount of quantization noise generated is shaped to high-frequency to make the in-band noise negligible. The out-of-band quantization noise is then low-pass filtered by the PLL loop dynamics.

FIG. 1 is a prior-art Digital FN-PLL with DTC-based "time-domain" $\Delta\Sigma$ quantization noise cancellation. Fractional divider quantization noise impacts both analog and digital FN-PLLs in a similar way. A digital FN-PLL evolved from a conventional charge-pump FN-PLL by replacing the phase detector/charge-pump, analog loop filter, and voltage-controlled oscillator (VCO) by time-to-digital converter (TDC) 120, digital loop filter 122, and digitally controlled oscillator (DCO) 124, respectively. TDC 120 measures and digitizes the phase difference between the reference clock REF and feedback clock DIV. TDC 120 output error signal $e_{TDC}[k]$ is filtered by digital loop filter 122 to obtain $D_C[k]$ which is then used to control DCO 124. Fractional divider 134 has $\Delta\Sigma$ noise-shaping modulator 132 that reduces the word length (m) of its digital input signal, x[k], to a few (1-6) bits, where the average of the dithered signal $x_{DIV}[k]$, controlling MMD 126, resembles the desired fractional factor $\alpha_{DIV}$. $\Delta\Sigma$ quantization noise can be cancelled in the digital domain from the TDC output after being accurately scaled or in the time domain using calibrated Digital-to-Time Converter (DTC) 128 added in the feedback path and modulated by accumulator 130 to implement a truly fractional divider. A DTC converts a digital signal in the digital domain to a time-domain signal, such as a clock edge. The digital signal can be a multi-bit digital signal. DTC 128 delays MMD 126 output clock edge DIV based on a digital delay control word (DCW) corresponding to the $\Delta\Sigma$ truncation error $e_Q[k]$. Because of the large dynamic delay range requirements on the DTC, its resolution, linearity, and supply-sensitivity performance are very crucial to achieve excellent spurious and phase noise performance of the FN-PLL. Hence, improved design techniques for DTC and TDC used in clock synthesis are desired.

What is desired is a Fractional-N Phase-Locked Loop (FN-PLL). In contrast to integer-N PLLs, the FN-PLL that offers flexibility in frequency planning using only a single crystal reference clock is more desirable. Techniques that can be leveraged in the implementation of data converters, PLLs, and frequency synthesizers to achieve improved performance are desired. In order to realize a high performance FN-PLL solution with excellent spurious and phase noise performance, it is desired to (1) develop a new architecture capable of cancelling $\Delta$ quantization noise while mitigating any non-linearity effects resulted from circuits imperfections instead of relying on aggressive low-pass filtering, (2) realize a high-resolution high-linearity low-noise TDC to achieve low in-band phase noise performance.

DETAILED DESCRIPTION

The present invention relates to an improvement in mixed-domain circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

Figure 2:
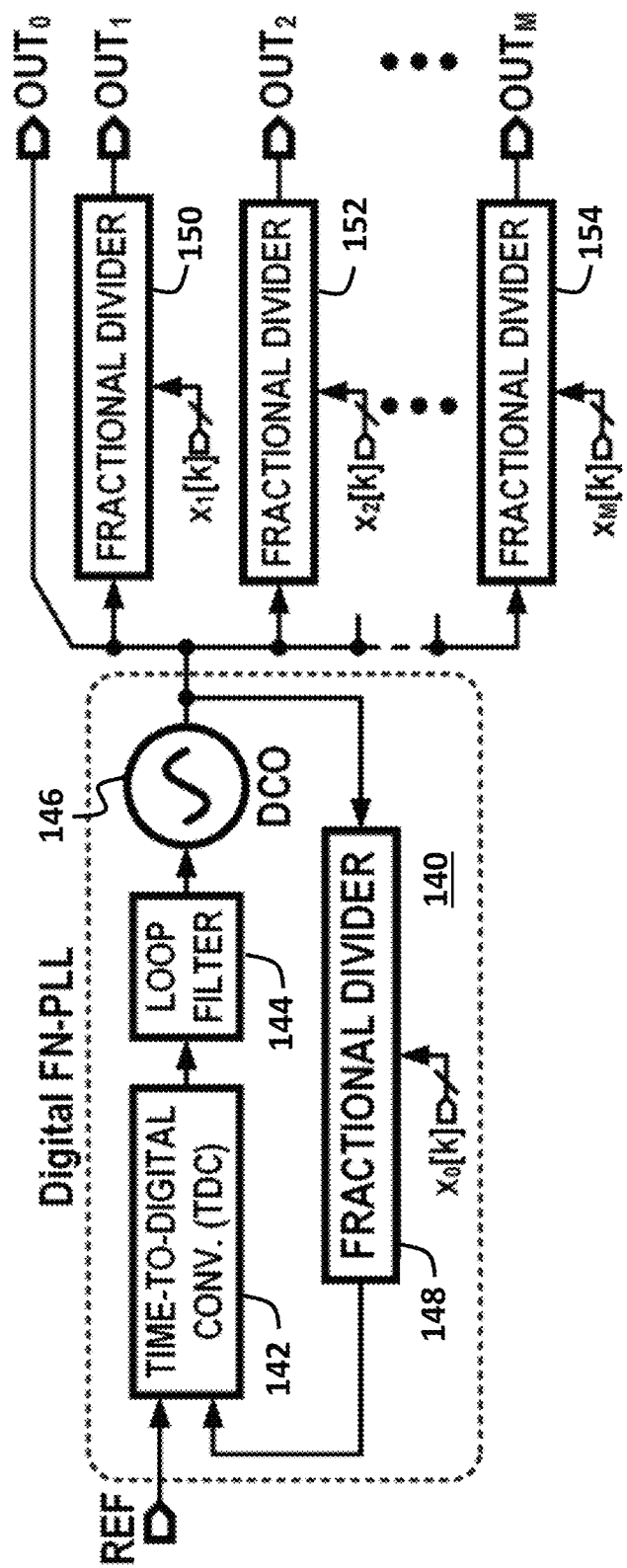
FIG. 2 shows a block diagram of a clock generation unit using digital FN-PLL and multiple open loop fractional dividers (FDIVs).

FIG. 2 shows a block diagram of a clock generation unit using digital FN-PLL and multiple open loop fractional dividers (FDIVs). FN-PLL 140 has TDC 142 that receives feedback from fractional divider 148 to control loop filter 144 that control DCO 146 to generate OUT0.

FN-PLL 140 generates ultra-low-jitter high frequency output clock, OUT0, from a low frequency reference clock REF. Open loop FDIVs 150, 152, . . . 154 generate multiple independent output clocks, OUTm, m=1, 2, . . . , M. The inventor proposes architectural- and circuit-level methods and apparatus to enhance the performance of clock and frequency synthesizers in order to achieve unparalleled spurious and phase noise performance.

FN-PLL System-Level Optimization

The inventor has analyzed the noise sources of a digital FN-PLL, namely TDC, feedback $\Delta\Sigma$ FDIV, DCO and their noise transfer functions. The inventor sees that PLL bandwidth plays a crucial role in determining the overall phase noise performance of the FN-PLL, and hence optimizing it under conflicting requirements is extremely challenging. A narrow PLL bandwidth helps to low-pass filter TDC quantization noise, and low-pass filter the shaped $\Delta\Sigma$ quantization noise, but this comes at the expense of inadequate filtering of oscillator phase noise. Oscillator phase noise is fundamentally dictated by noise-power trade-off of its circuitry. Hence, improving oscillator phase noise, to meet stringent integrated phase noise performance requirements can dramatically increase power consumption or in many events may not be readily achievable in practice.

The inventor believes that a better strategy is to extend the PLL bandwidth to aggressively suppress oscillator phase noise and relax its requirements. This is accompanied by (1) improvement in the phase noise performance of the reference clock signal, (2) architecture innovations to cancel $\Delta\Sigma$ quantization noise instead of relying on the inherent low-pass filtering, (3) realization of a high-resolution high-linearity low-noise TDC to achieve low in-band phase noise performance.

First, the reference clock signal REF may be provided by a highly stable oscillator such as a crystal oscillator, or a microelectromechanical (MEMS)-based oscillator, or other adequate sources. Typically, these reference oscillators rely on resonators with a very high quality-factor (Q) to generate relatively low frequency clock, allowing it to achieve superior phase noise performance with very small power penalty.

Second, to understand the architectural modification to realize precise $\Delta\Sigma$ quantization noise cancellation, it is instructive to first review the behavior of $\Delta$E-FDIV. To this end, consider a simple dual-modulus divider whose division ratio ($\frac{2}{3}$ in this example) is controlled by a first order $\Delta\Sigma$ modulator. A division ratio of 2.25 ($N_{DIV}$=2 and $\alpha_{DIV}$=0.25) is realized by dividing the DCO clock, with period $T_{DCO}$, by 2 for three cycles and by 3 for one cycle in a repetitive manner, as shown later in FIG. 4. Comparing the MMD output DIV positive clock edge to the ideal reference REF positive clock edge reveals that $\Delta\Sigma$ quantization noise appears as a deterministic jitter (DJ) of 0.25 $T_{DCO}$ added in the first cycle, 0.5 $T_{DCO}$ in the second cycle, and accumulates to 0.75 $T_{DCO}$ by the third cycle. In the fourth cycle, output clock realigns with the ideal clock (DJ=0) and this DJ pattern repeats every four cycles. This DJ behavior is a direct result of truncating input frequency control word (FCW), x[k], and can be expressed in terms of $\Delta\Sigma$ phase truncation error, $e_Q[k]$, as DJ[k]=−$e_Q[k]$×$T_{DCO}$. Using a first order $\Delta\Sigma$ modulator, $e_Q[k]$ is typically bounded between 0 to 1. The inventor clearly notices that this large DJ appears as high frequency noise shaped phase error at the TDC input. As a result, TDC input dynamic range must be large enough to measure this error, yet its resolution and linearity performance are very crucial to prevent noise folding of this shaped quantization error.

Higher order $\Delta\Sigma$ modulators are typically used in FN-PLLs, where a static or $D_C$ input FCW is used, to avoid the strong tonal behavior of first order $\Delta\Sigma$ modulators. But this comes at the expense of increased dynamic range requirements for Quantization Noise Cancellation (QNC) to at least $2^{P-1} \times T_{DCO}$, where P is $\Delta\Sigma$ modulator order and $T_{DCO}$ is DCO output period. As a result, the TDC has to cover a very large dynamic range (~100s of ps), which is very difficult to achieve in practice and will dramatically degrade its resolution, linearity, noise, and supply-sensitivity performance. Adding a Digital-to-Time Converter (DTC) after the MMD in the feedback path is a very efficient QNC method as it alleviates TDC dynamic range requirements, and the FN-PLL behaves more like an integer-N PLL, where reference and feedback clocks are aligned. DTC-based QNC methods are also easily employed to output open loop FDIVs as shown in FIG. 2, where their spurious and phase noise performance is mostly dependent on the accuracy of their DTC. Based on the assumption that a high-resolution DTC can be designed more power efficiently and with less hardware complexity compared to a TDC, a FN-PLL architecture using a wide dynamic range, high-resolution DTC and narrow dynamic range, high-resolution TDC can potentially achieve superior spurious and phase noise performance.

Differential DTC Architecture

Compared to prior-art approaches, where DTC delays one clock edge, either DIV or REF, the inventor uses two identical DTCs, where one DTC uses REF as an input and the other DTC uses DIV as an input, to form a differential DTC architecture. Because the TDC measures and digitizes the phase difference between its input clock edges, the $\Delta\Sigma$ quantization error, to be cancelled, can be viewed as a delay difference between REF and DIV clock edges. Therefore, by creating an opposite delay difference between REF and DIV clock edges using the differential DTC, $\Delta\Sigma$ quantization noise can be completely cancelled in a differential sense even though now both REFD and DIVD clock signals still contain half the original $\Delta\Sigma$ quantization error.

Figure 3:
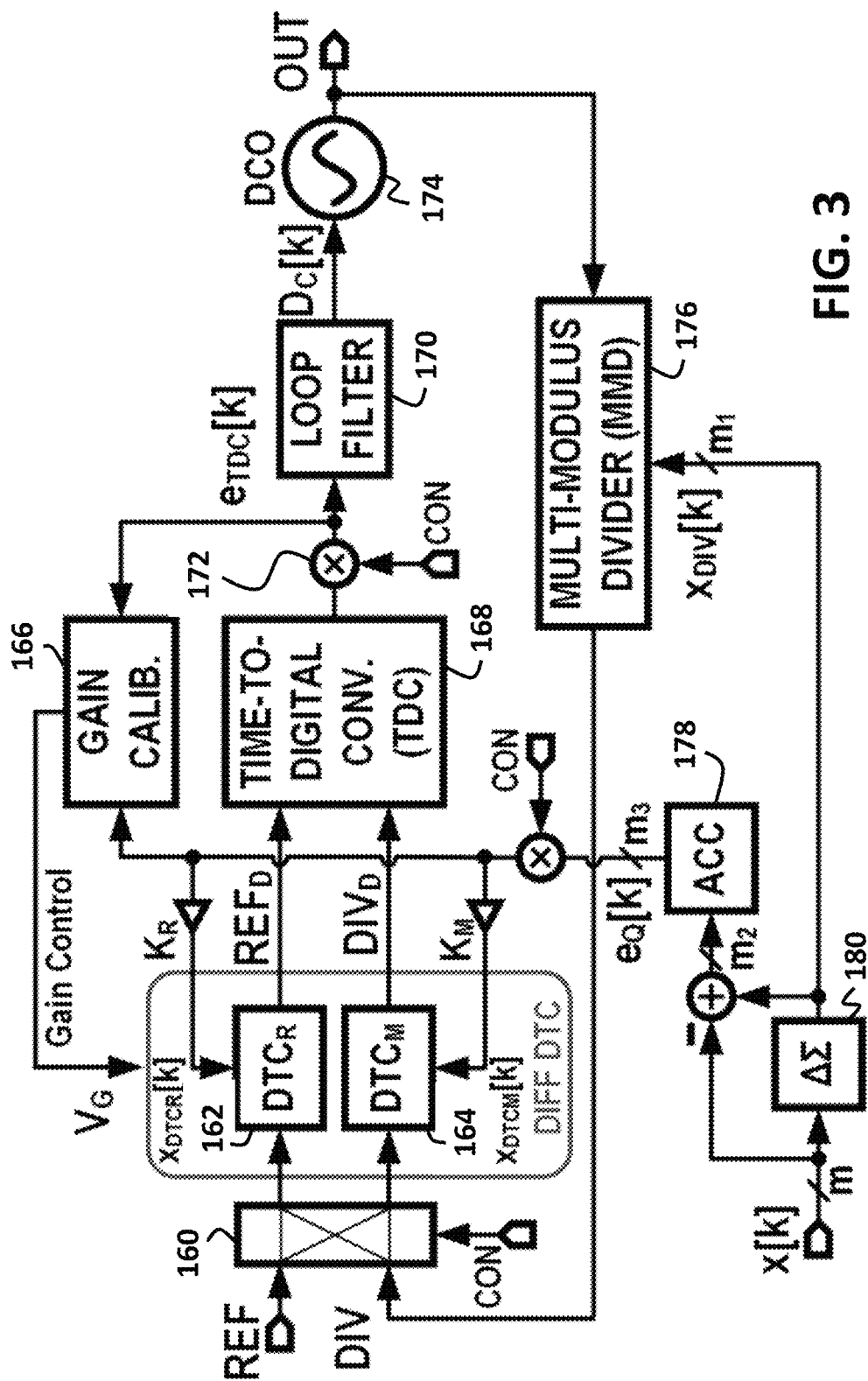
FIG. 3 shows a block diagram for a digital FN-PLL with a differential DTC architecture for Quantization Noise Cancellation (QNC).

FIG. 3 shows a block diagram for a digital FN-PLL with a differential DTC architecture for Quantization Noise Cancellation (QNC). The differential DTC has two identical and perfectly matched DTCs, one in the reference clock path, DTCR 162, and the other in the divider clock path, DTCM 164. The differential outputs from DTCR 162 and DTCM 164 keep the reference and feedback paths separate until TDC 168 combines the outputs of DTCR 162 and DTCM 164.

Similar to a conventional FN-PLL, ΔΣ noise-shaping modulator 180 reduces the word length (m) of its digital input signal, x[k], to a few (1-6) bits, where the average of the dithered signal $x_{DIV}$[k], controlling MMD 176, resembles the desired fractional factor $\alpha_{DIV}$. The quantization noise cancellation scheme includes an adder, and digital accumulator 178 for frequency-to-phase conversion. The resulting ΔΣ phase truncation error $e_Q$[k] is digitally scaled by gain factors $K_R$ and $K_M$ to generate the delay control words (DCWs)$\times x_{DTCR}$[k] for DTCR 162 and $x_{DTCM}$[k] for DTCM 164, respectively.

The differential architecture of DTCR 162 and DTCM 164 allows these differential paths to be swapped to completely remove any path-dependent mis-match noise to flicker noise. The inputs to DTCR 162 and DTCM 164 can be swapped by switch network 160 to allow the reference clock to alternately pass through DTCR 162 and DTCM 164. REF and DIV clock inputs can be swapped in response to chopping control signal CON by switch network 160, which swaps the inputs applied to DTCR 162 and DTCM 164. The phase truncation error $e_Q$[k] is modulated by the CON signal before its scaling by $K_R$ and $K_M$. TDC 168 combines the outputs of DTCR 162 and DTCM 164. The output of TDC 168 is modulated with CON to multiplier 172 to control loop filter 170 and then DCO 174 to generate output clock OUT.

Thus the effect of flicker noise in the DTC and TDC is reduced using chopper stabilization. Multiplier 172 also drives an input to gain calibrator 166 which generates a gain control signal to DRCR 162 and DTCM 164.

Figure 4:
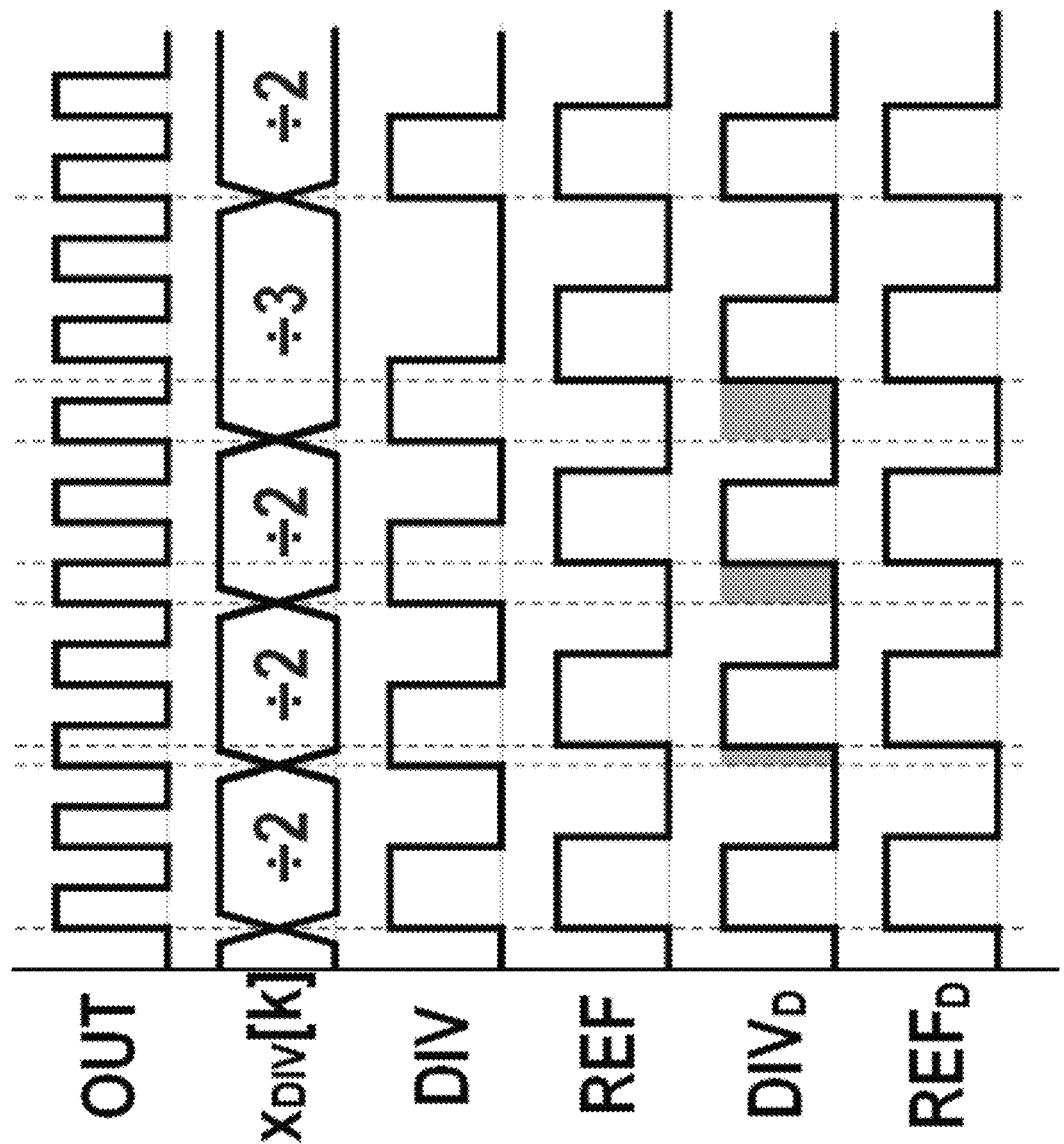
FIG. 4 shows a timing diagram of DTC-based $\Delta\Sigma$ QNC using a divider-path DTCM only.

FIG. 4 shows a timing diagram of DTC-based ΔΣ QNC using a divider-path DTCM only, where $K_R$=0, $K_M$=1 are set. In this single-ended scheme, DCW of DTCR 162 (FIG. 3), $x_{DTCR}$[k], is fixed to 0, while DCW of DTCM 164, $x_{DTCM}$[k]=$e_Q$[k]. Phase error accumulates on DIVD but does not accumulate on REFD.

Figure 5:
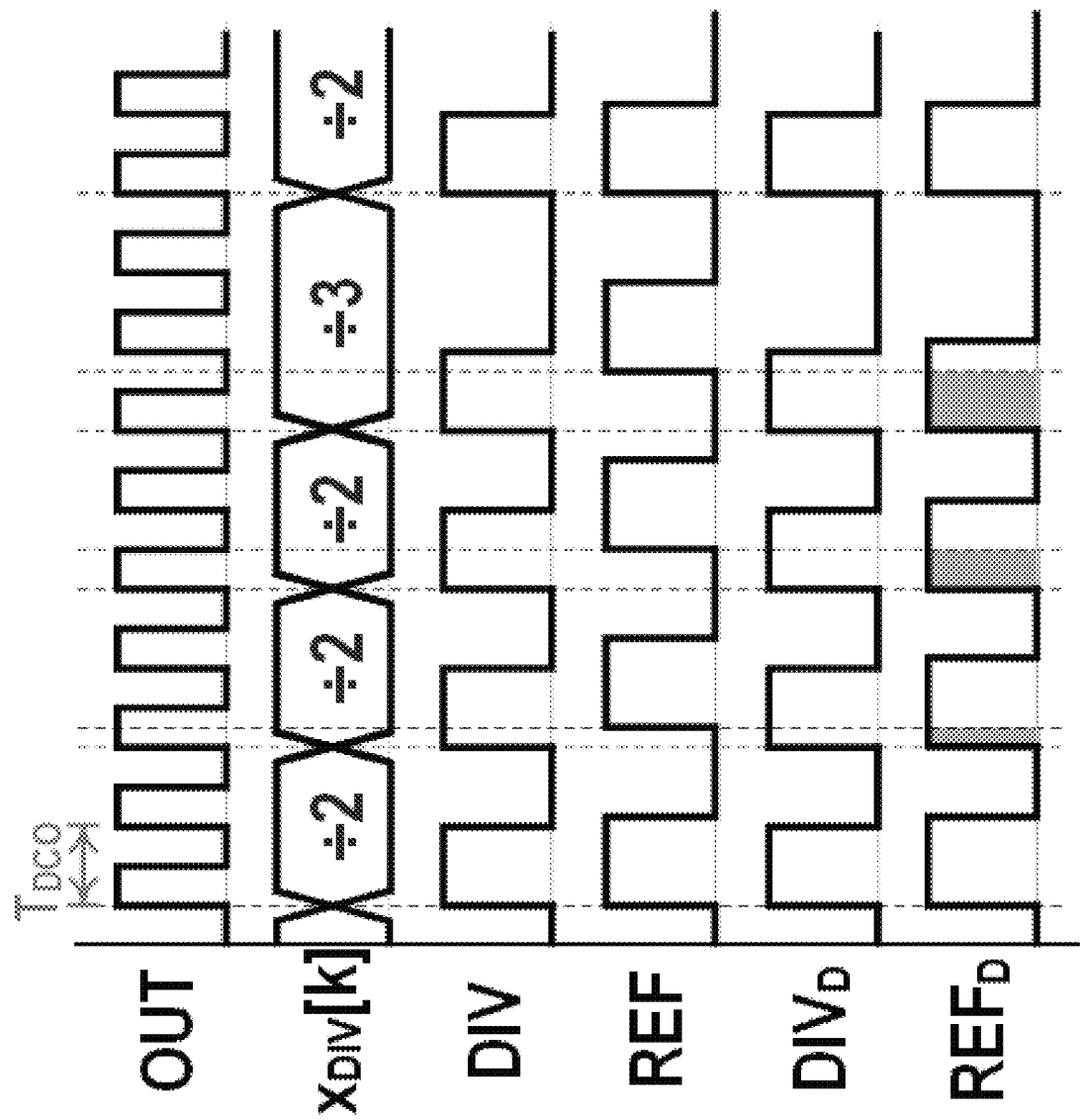
FIG. 5 shows a timing diagram of DTC-based $\Delta\Sigma$ QNC using a reference-path DTCR only.

FIG. 5 shows a timing diagram of DTC-based ΔΣ QNC using reference-path DTCR only, where $K_R$=−1, $K_M$=0 are set. In this single-ended scheme, DCW of DTCM 164 (FIG. 3), $x_{DTCM}$[k], is fixed to 0, while DCW of DTCR 162, $x_{DTCR}$[k]=$e_Q$[k]. In FIG. 5 REFD edges are shown to be advanced in time compared to REF clock edges (illustrating a negative input DCW), which is physically wrong. In reality, both DTCR 162 and DTCM 164 have offset delay $t_{OS}$, which corresponds to the total output delay of the DTC at zero input code, x=0, such that the DTC has a non-zero positive delay even for the minimum input code.

Figure 6:
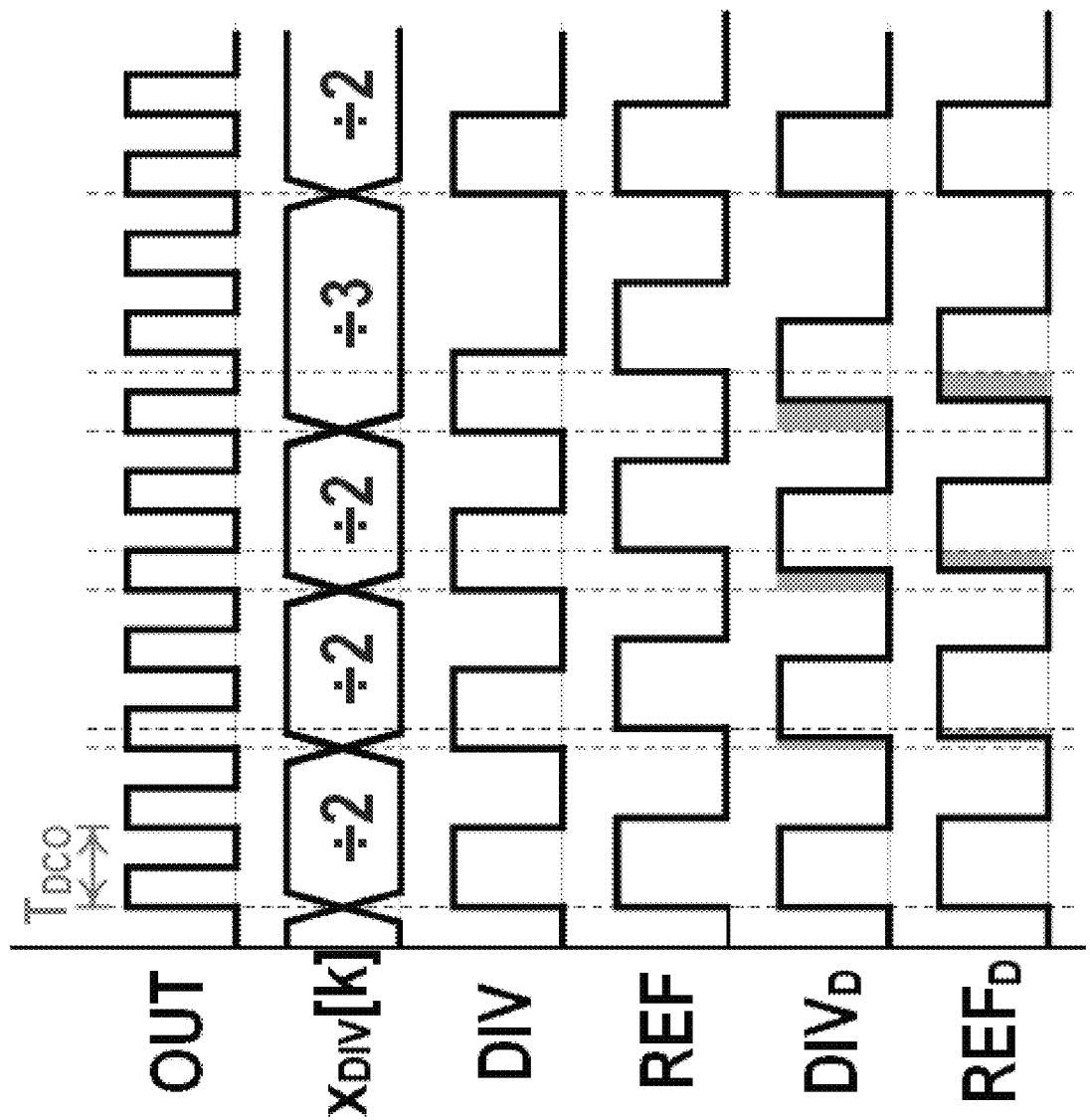
FIG. 6 shows a timing diagram of DTC-based $\Delta\Sigma$ QNC using both reference-path DTCR and divider-path DTCM.

FIG. 6 shows a timing diagram of DTC-based ΔΣ QNC using both reference-path DTCR and divider-path DTCM, where $K_R$=−0.5, $K_M$=0.5 are set. In this differential-ended scheme, DCW of both DTCR 162 and DTCR 164 (FIG. 3) are changing in a complementary fashion, where $x_{DTCR}$[k]−$e_Q$[k]/2, and $x_{DTCM}$[k]$_Q$[k]/2.

A DTC gain error, defined as the deviation of DTC range from $2^{P-1} \times T_{DCO}$, where P is ΔΣ modulator order and $T_{DCO}$ is DCO output period, would leak ΔΣ truncation error to output. Process, Voltage, and Temperature (PVT) and aging variations, and changing output target frequency cause a DTC gain error. A gain calibration unit correlates TDC output $e_{TDC}$[k] with $e_Q$[k] to tune the differential DTC gain using a calibration control voltage $V_G$.

Leveraging the differential nature of the differential DTC architecture, DTC and TDC flicker noise can be considerably reduced using chopping and Correlated Double Sampling (CDS). Using switch network 160 (FIG. 3) at the differential DTC input to flip its REF and DIV inputs, and flipping its digital inputs $x_{DTCM}$[k] and $x_{DTCR}$[k] and TDC output $e_{TDC}$[k] by multiplying by −1, the PLL effectively operates properly. Knowing that flicker noise is a low-frequency effect, the inventor modulates it, using control signal CON, into an out-of-band frequency where it will be low-pass filtered by the PLL.

Figure 1:
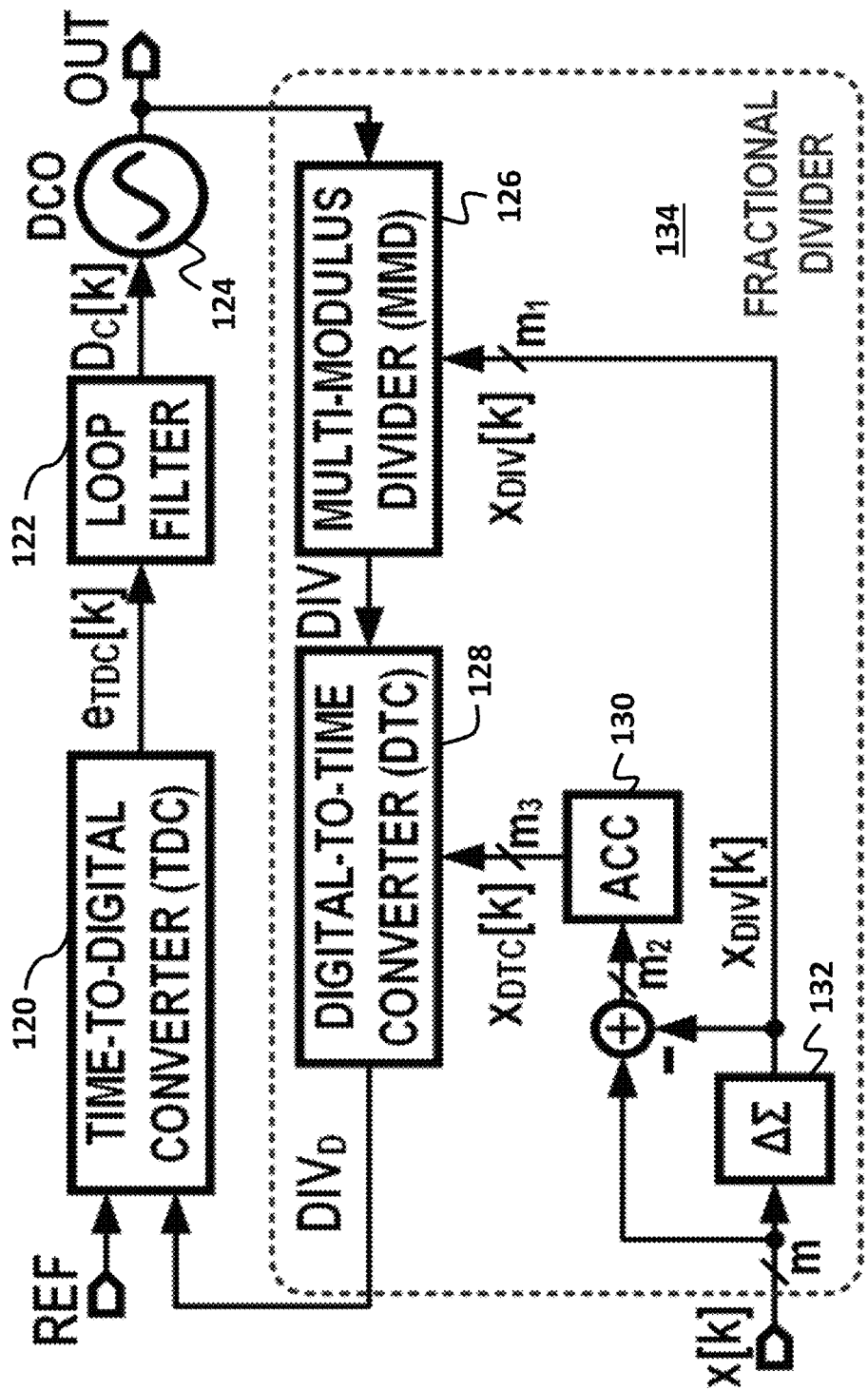
FIG. 1 is a prior art Digital FN-PLL with DTC-based "time-domain" $\Delta\Sigma$ quantization noise cancellation.

The differential DTC architecture offers unparalleled advantages compared to a prior-art single-ended approach. To understand how superior differential DTCs are over single-ended DTCs, it is instructive first to look closely at DTC transfer characteristics. For N-bit DTC, a signed digital delay control word (DCW) input, x, can take any value from $x_{min}$=−$2^{N-1}$ to $x_{max}$=+$2^{N-1}$−1. Ideally, the total output delay of the DTC, $t_{DTC}$(x), for a control word, x, can be described as follows:

$$t_{DTC}(x) = t_{OS} + K_{DTC} x \quad (1)$$

where $t_{OS}$ is DTC total output delay at zero input code, x=0, which can be treated as a time offset, and $K_{DTC}$ is the DTC gain defined as the delay change per LSB. Assuming a second order ΔΣ modulator, the fractional divider phase quantization error, $e_Q$[k], will be manifested as a DJ pattern with up to ±$T_{DCO}$ range. Hence, DTC dynamic range is at least 2$T_{DCO}$. Ideally, using a single-ended DTC in the feedback path (FIG. 1), perfect QNC can be realized by using x=$e_Q$[k] as DTC input directly, and ensuring DTC gain is calibrated to match DCO period as dictated by: $K_{DTC}$=2$T_{DCO}$/$2^N$. However, in practice, DTC output delay is a non-linear function of its input code, x, and generally it is very sensitive to its supply noise voltage, which can introduce a non-linear dynamic delay error, denoted as $t_{VDD}$ (VDD). Therefore, the total output delay of the DTC can be expressed as:

$$t_{DTC}(x) = t_{OS} + K_{DTC}(VDD)x + \underbrace{c_2 x^2 + c_3 x^3 + \ldots + c_L x^L}_{\text{non-linearity terms}} + \underbrace{t_{VDD}(VDD)}_{\text{supply noise term}} \quad (2)$$

where $c_2, c_3, \ldots, c_L$ represent the real valued polynomial coefficients describing DTC non-linearity. It can be seen, in the conventional single-ended scheme (FIG. 1) where one DTC is used in the feedback path and REF clock is used as positive terminal of the TDC directly, the non-linearity delay terms and supply error delay term will affect only the DIVD clock edge (TDC negative terminal). As a result, the TDC will measure these undesired delay errors. Now the TDC output, $e_Q$[k] will be corrupted by DTC non-linearity and supply-noise and pass them to the digital loop filter indistinguishable from the desired error signal of the loop. Because of the PLL's wide bandwidth, these undesired errors will not be adequately filtered, and will significantly degrade the spurious and phase noise performance of the PLL. This especially true when fractional factor $\alpha_{DIV}$ is very close to 0 or 1.

On the other hand, as discussed earlier, in the differential-ended scheme, DCW of both DTCR 162 and DTCM 164 (FIG. 3) are changing in a complementary fashion, where x[k]=$x_{DTCM}$[k]−$x_{DTCR}$[k]=$e_Q$[k]/2. Because TDC 168 measures and digitizes the time difference between delayed reference clock edge REFD and delayed divider clock edge DIVD (FIG. 3), TDC 168 will only detect the difference between the total output delay of DTCR 162 and DTCM 164. The delay of the differential DTC, $t_{DTC\_DF}(x)$, can be expressed in terms of the absolute output delay of DTCR 162 and DTCM 164 as follows:

$$t_{DTC\_DF}(x) = t_{DTCM}(x) - t_{DTCR}(-x) \qquad (3)$$

$$t_{DTCM}(x) = t_{OSM} + K_{DTCM}(VDDM)x + \underbrace{c_{M2}x^2 + c_{M3}x^3 + \ldots + c_{ML}x^L}_{\text{non-linearity terms}} + \underbrace{t_{VDDM}(VDDM)}_{\text{supply noise term}} \qquad (4)$$

$$t_{DTCR}(-x) = t_{OSR} + K_{DTCR}(VDDR)(-x) + \underbrace{c_{R2}(-x)^2 + c_{R3}(-x)^3 + \ldots + c_{RL}(-x)^L}_{\text{non-linearity terms}} + \underbrace{t_{VDDR}(VDDR)}_{\text{supply noise term}} \qquad (5)$$

Assuming DTCR 162 and DTCM 164 are identical and perfectly matched, then they can have the same time offset $t_{OS}=t_{OSM}=t_{OSR}$, gain $K_{DTC}=K_{DTCM}=K_{DTCR}$, and non-linearity coefficients $c_2, c_3, \ldots, c_L$. By tying the supply voltage of both DTCR 162 and DTCM 164 tightly together, VDD=VDDM=VDDR, they also have the same supply noise term $t_{VDD}(VDD)$. As a result, the time offset, supply noise, and even-order non-linearity terms will cancel each other. Hence, differential DTC delay can be simplified as follows:

$$t_{DTC\_DF}(x) = 2K_{DTC}(VDD)x + \underbrace{c_3x^3 + c_5x^5 + \ldots + c_{2L-1}x^{2L-1}}_{\text{odd-order non-linearity terms}} \qquad (6)$$

Using the differential-ended DTC (FIG. 3) with $x=e_Q[k]/2$ as the DTC differential input, and ensuring DTC gain, $K_{DTC}$, is calibrated to match the DCO period as dictated by: $K_{DTC}=T_{DCO}/2^N$, a very accurate QNC can be realized. Equation (6) clearly demonstrates the superiority of the differential DTC scheme over the single-ended DTC scheme, where only odd-order non-linearity terms are significant. As will be explained later, odd-order non-linearity coefficient $c_3$ is typically an order of magnitude smaller than even-order non-linearity coefficient $c_2$ in practical DTC implementations.

Another advantage of using differential DTC in FN-PLL is related to dynamic range requirements. The required dynamic range of both DTCR 162 and DTCM 164 is reduced by half to only one $T_{DCO}$. As explained later, the power, area, and noise performance of the differential-ended DTC architecture (using two DTCs each with $T_{DCO}$ dynamic range) will not be very different than a conventional scheme (using a single DTC with $2T_{DCO}$ dynamic range). Nevertheless, Integral Non-Linearity (INL) performance of DTCs (and data converters in general) are directly related to their dynamic range.

Figure 7:
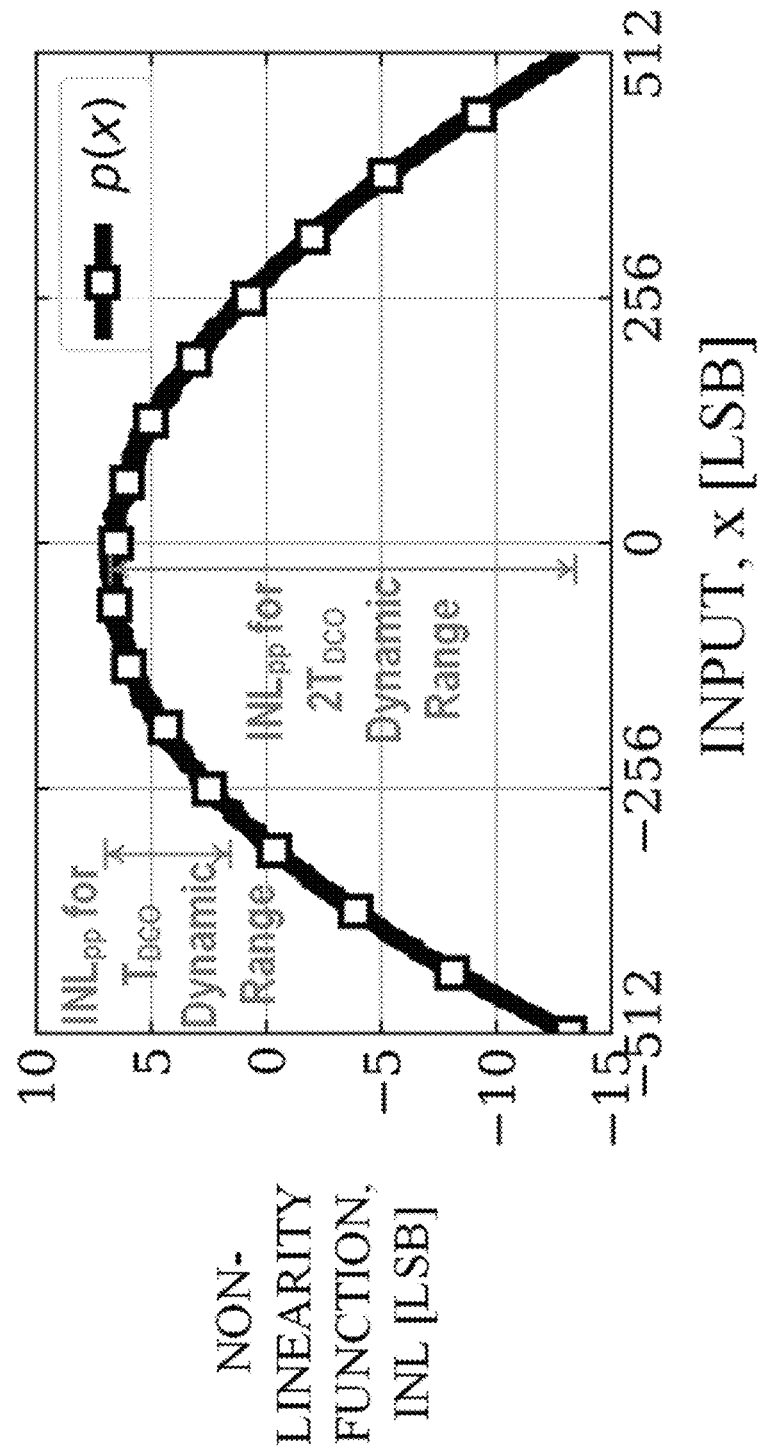
FIG. 7 is a graph showing an example of a best-fit straight-line INL function of a typical 10-bit DTC, p(x).

FIG. 7 is a graph showing an example of a best-fit straight-line INL function of a typical 10-bit DTC, p(x). FIG. 7 demonstrates that the peak-to-peak INL is reduced by almost a factor of 4 by cutting the required dynamic range by half to only one $T_{DCO}$.

Figure 8:
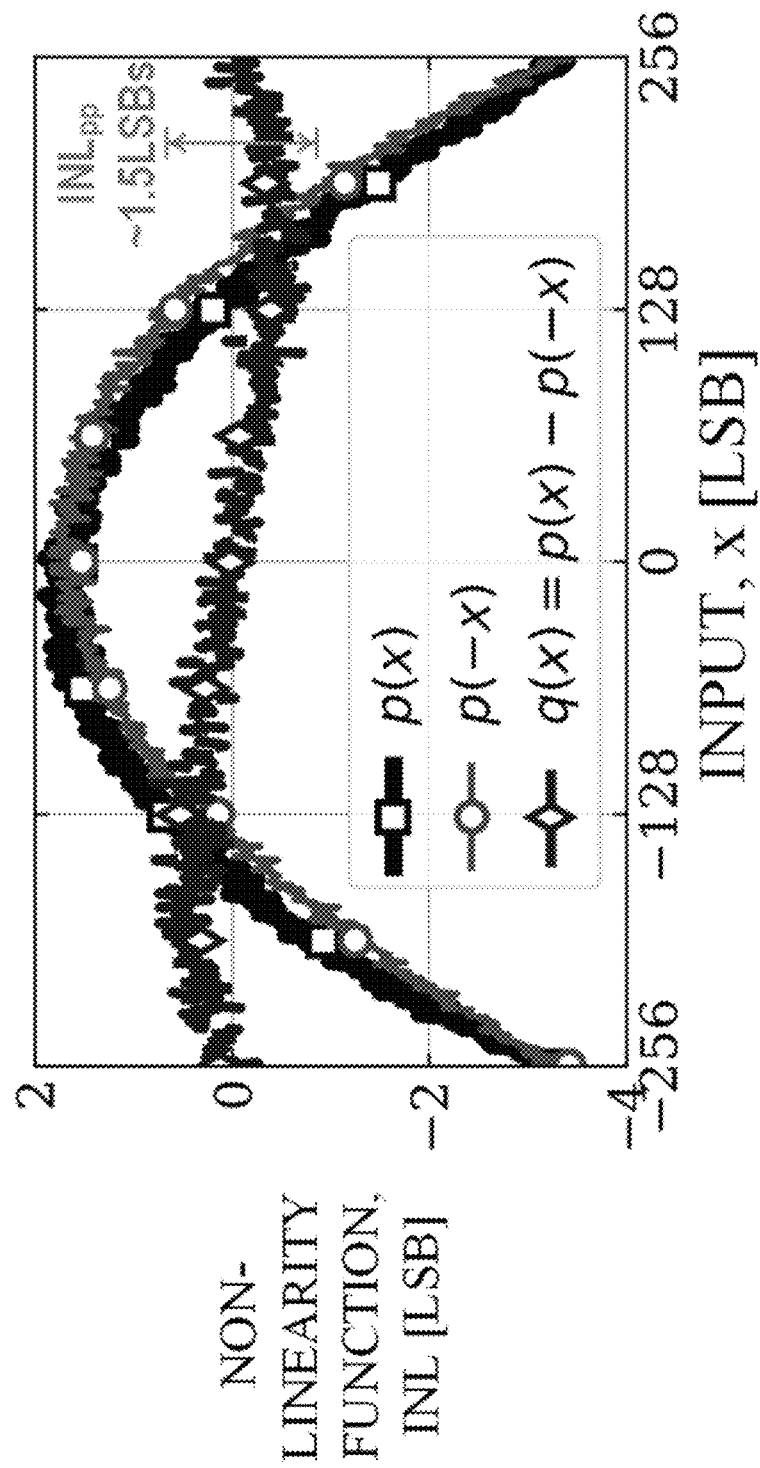
FIG. 8 shows the DTCM INL function, p(x), with a reduced number of bits (9-bits) after dynamic range reduction assuming the same resolution.

FIG. 8 shows the DTCM INL function, p(x), with a reduced number of bits (9-bits) after dynamic range reduction assuming the same resolution. FIG. 8 also shows the INL function, p(-x), of the complementary DTCR, and the residual INL function, q(x)=p(x)-p(-x), of the differential DTC scheme fog FIG. 3. Because DTC INL function, p(x), is typically dominated by even-order non-linearity, the residual peak-to-peak INL of q(x) is significantly improved to less than 1.5 LSBs, compared to 20 LSBs in case of conventional single-ended DTC scheme.

The inventor notes that the residual odd-order non-linearity can be compensated using additional non-linearity compensation techniques. The inherent suppression of even-order non-linearity in the differential DTC of FIG. 3 can be leveraged to considerably relax the complexity of the non-linearity compensation unit. Adaptive non-linearity compensation techniques for improving FN-PLL phase noise and spurious performance are described by the inventor in U.S. Pat. No. 10,594,329, filed Dec. 7, 2018, entitled "Adaptive Nonlinearity Identification and Compensation Using Orthogonal Functions in a Mixed Signal Circuit," naming Ahmed Elkholy as an inventor, which application is hereby incorporated by reference.

Open Loop FDIV

Figure 9:
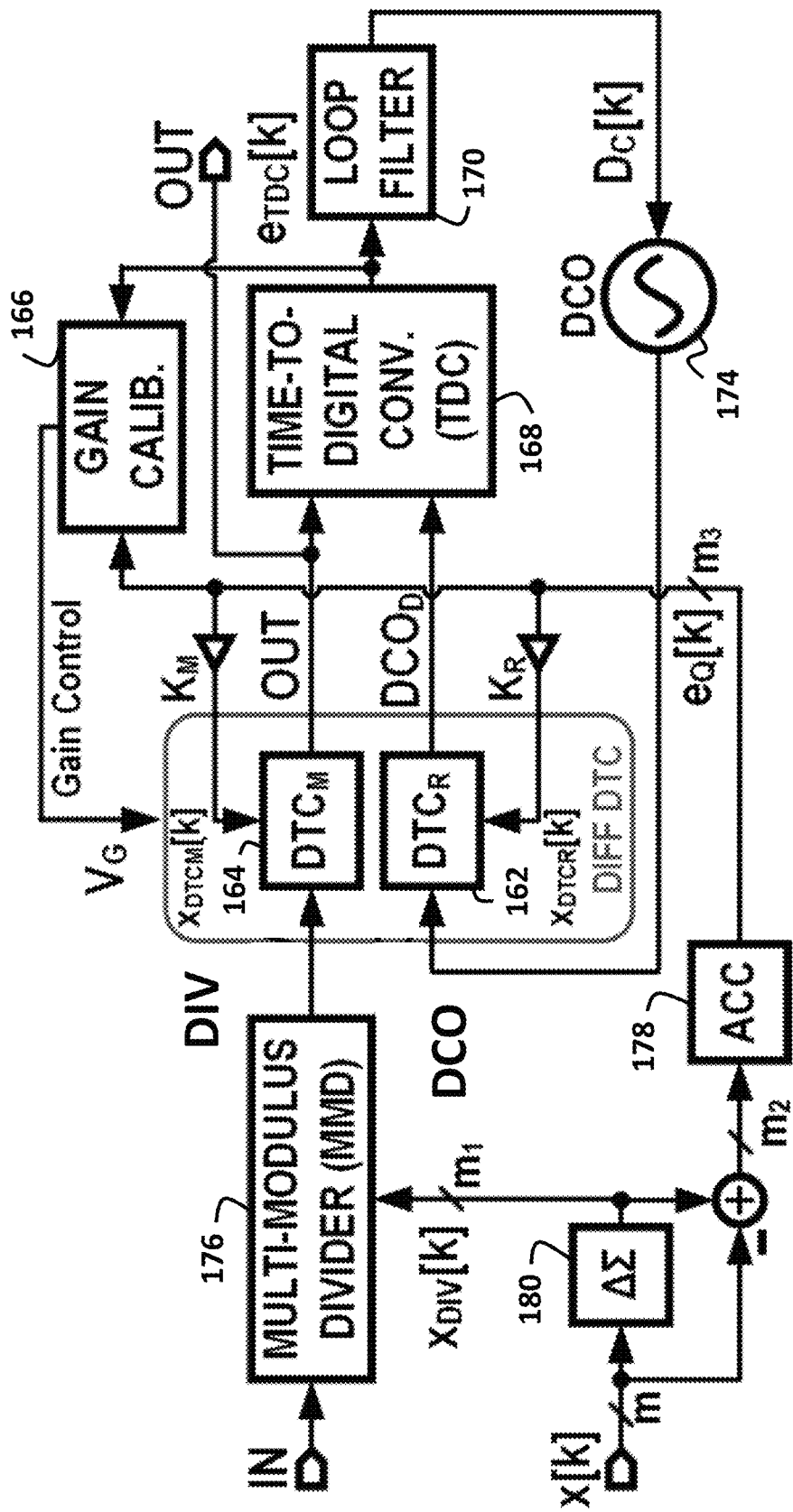
FIG. 9 is simplified block diagram of a background calibrated open loop FDIV.

FIG. 9 is simplified block diagram of a background calibrated open loop FDIV. The output clock OUT is taken from DTCM 164 rather than from DCO 174.

Multi-Modulus Divider (MMD) 176 is followed by DTCM 164 that performs QNC. But to perfectly cancel ΔΣ quantization error $e_Q[k]$, the DTC gain is calibrated to match the input clock period, $T_{IN}$. To cancel all ΔΣ quantization error from the OUT clock signal, DTC-based ΔΣ QNC using divider-path DTCM 164 only, where $K_R=0$, $K_M=1$ are set. In this single-ended scheme, DCW of DTCR 162, $x_{DTCR}[k]$, is fixed to 0, while DCW of DTCM 164, $x_{DTCM}[k]=e_Q[k]$. A digital PLL-based calibration unit is employed.

The PLL has a unity multiplication factor, and it will low-pass filter the residual out-of-band quantization error in the OUT clock signal, such that its DCO 174 output acts a clean clock for residual error detection. When the PLL is locked, its TDC 168 detects the leaked ΔΣ quantization error due to DTC gain error and DTC INL. Gain calibration unit 166 correlates TDC 168 output $e_{TDC}[k]$ with $e_Q[k]$ to tune the differential DTC gain using a calibration control voltage $V_G$. The PLL may use compact noise components (like a ring DCO, relatively low resolution TDC, . . . etc) to save power consumption and area, as its noise does not affect open loop FDIV output clock OUT. Loop filter 170, ΔΣ modulator 180, and accumulator 178 operate in a conventional manner.

Differential Variable-Slope DTC

Figure 10:
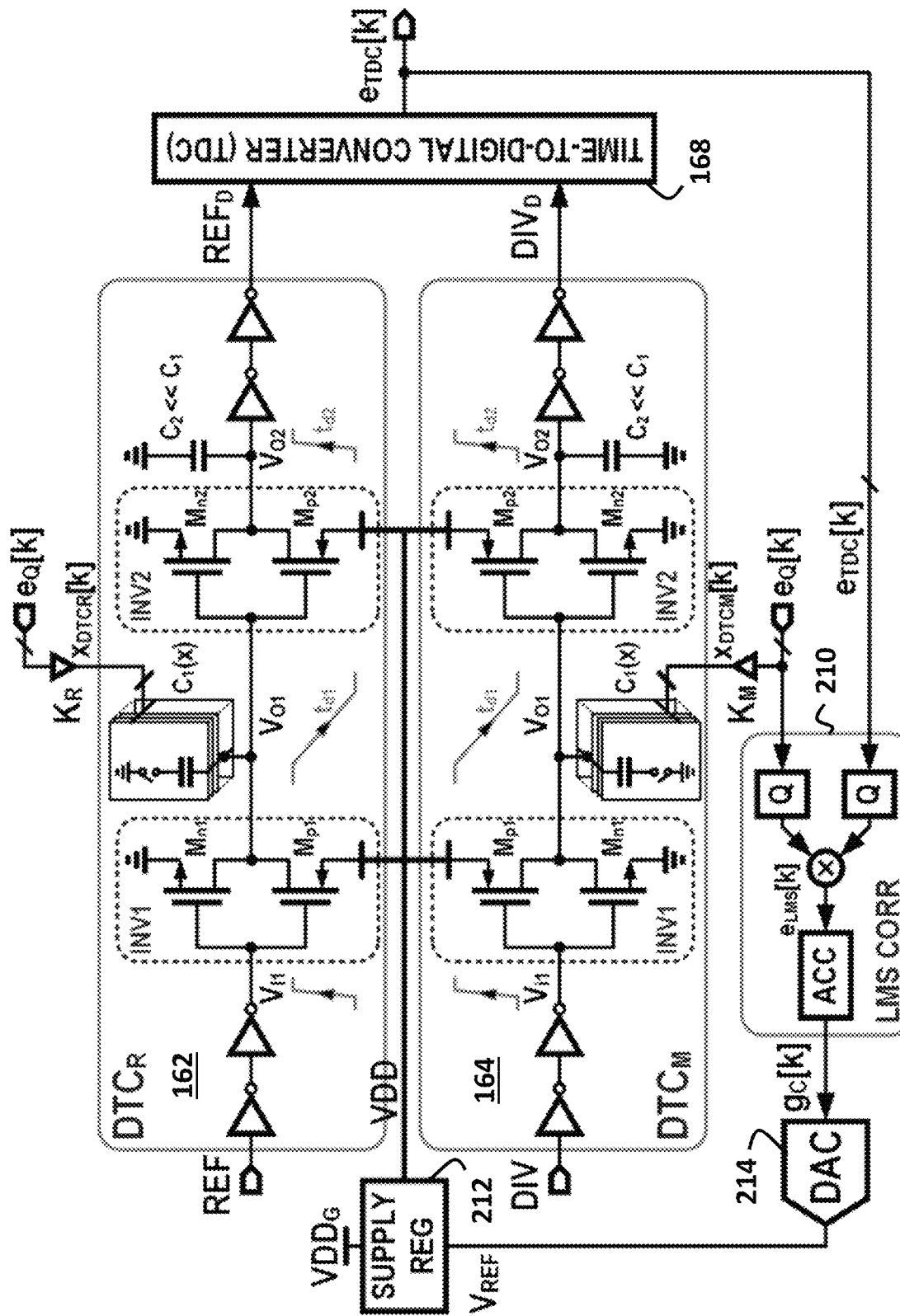
FIG. 10 shows a variable-slope embodiment of the differential DTC, where identical and perfectly matched DTCR and DTCM are implemented using CMOS inverters.

FIG. 10 shows a variable-slope embodiment of the differential DTC, where identical and perfectly matched DTCR and DTCM are implemented using CMOS inverters. FIG. 10 can be a subset of either of the PLL's shown in FIGS. 3, 9, receiving input clock REF, feedback clock DIV, accumulated modulation $e_Q[k]$, and generating the digital error value $e_{TDC}[k]$ that can control the digital loop filter and DCO of the PLL.

A simple implementation of DTCR 162 and DTCM 164 is based on a Digitally-Controlled Delay Line (DCDL) using a cascade of two CMOS inverters, where first inverter, INV1, is loaded with a digitally programmable capacitor bank to act as a linearly programmable delay element. The second inverter, INV2, acts as a voltage comparator. The output of TDC 168 is fed back through Least Mean Square (LMS) correlator 210 and DAC 214 to apply DTC gain calibration through the power supply, as discussed later.

The total delay of a DTC slice, $t_{DTC}(x)$, for an input control word, x, is the sum of the delay of the two cascaded inverters $t_{d1}(x)$ and $t_{d2}(x)$.

Analysis of inverter delay using the α-power law MOS model shows that $t_{d1}(x)$ is directly proportional to its load capacitance $t_{d1}(x) \propto C_1(x) = C_o + \Delta x \cdot C_u$, where $C_o$ is the total load capacitance when all $2^N-1$ switched capacitors are OFF and $\Delta x \cdot C_u$ is the extra capacitance when $\Delta x = x - x_{min}$ (unsigned number) unit capacitor cells are switched ON. Random mismatch between the unit cells in the capacitor bank introduces non-linearity. Increasing the unit cell size $C_u$ helps to minimize the resulting INL. The relative standard deviation of the unit capacitor must be better than the target linearity performance. Special care is recommended during layout of the capacitor bank to minimize gradient-based errors and other systemic non-linearity errors. Another source of INL is due non-linear behavior in $C_1$ itself (i.e. $C_1$ is function of node voltage $V_{O1}$), as $C_1$ may include voltage-dependent capacitance from capacitor bank and INV2 input capacitance. This will cause $t_{d1}(x)$ to change non-linearly with the load capacitance.

Because TDC 168 performs the phase comparison either on positive or negative clock edges, accurate delay generation from DTC is focused on one edge. In the implementation shown in FIG. 10, TDC 168 works on positive clock edges of REFD and DIVD, the focus here is on the relevant high-to-low output ($V_{O1}$) transition, and low-to-high output ($V_{O2}$) transition. During these transitions, DTC adds phase jitter, which scales inversely proportional to its power consumption. The phase jitter/noise performance of DTC is important, as it can limit the in-band phase noise performance of FN-PLL and open loop FDIVs. DTC phase noise appears at FN-PLL output after passing through the same noise transfer function as reference clock, where its phase noise is multiplied by the PLL multiplication factor. The other DTC output edge (negative edge in this implementation) can be relatively noisy to save power consumption in FN-PLL, as it is not used by the TDC and will not affect the loop.

Current consumption of a DTC slice is mostly dynamic and directly proportional to its load capacitances $C_1(x)$ and $C_2$, clock frequency $F_{REF}$, and supply voltage VDD. Because $C_1(x)$ is a strong function of input code x, current drawn from the supply is code-dependent and can disturb the power supply with code-dependent supply ripples, potentially introducing DTC dynamic errors and affecting other sensitive block that uses the same supply. This can manifest itself as fractional spurs degrading PLL phase noise and spurious performance.

Figure 11:
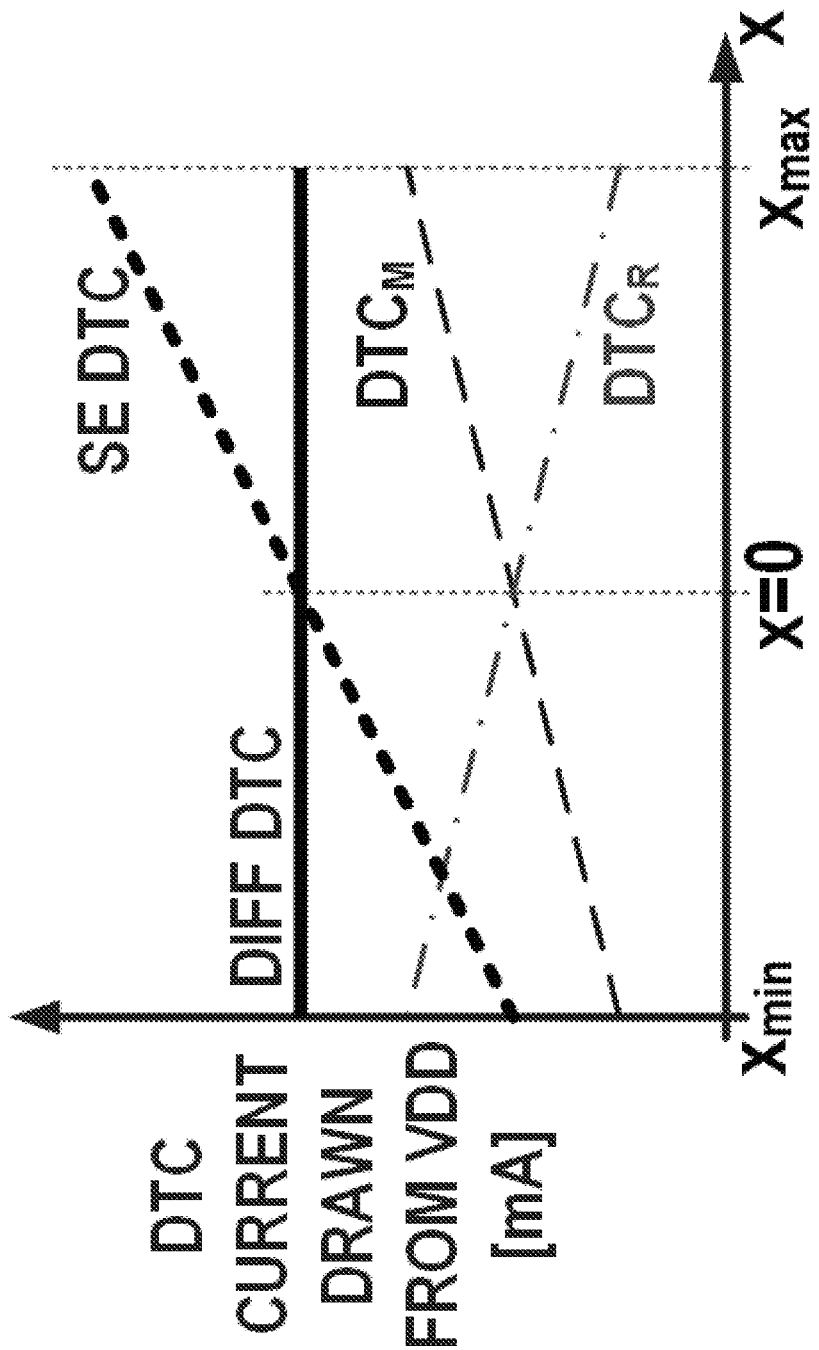
FIG. 11 is a graph of DTC current consumption versus input code.

FIG. 11 is a graph of DTC current consumption versus input code x. Single-ended DTC current (SE DTC) is strongly dependent on its input code x, potentially deteriorating FN-PLL phase noise and spurious performance.

A differential DTC consisting of DTCR and DTCM are driven by complementary inputs and share the same supply voltage. Hence, at any input code x, the total charge pulled from the supply in every transition is the same, therefore differential DTC total current consumption (DIFF DTC) is independent of its input code helping to achieve very robust and superior phase noise and spurious performance. For open loop FDIVs which uses only one DTC, a dummy DTC driven by complementary code −x can be added to keep total charge pulled from the supply in every transition constant at the expense of doubling the power consumption.

DTC 162, 164 (FIG. 10) can be viewed as having a two-stage operation of (1) delay generation and (2) voltage comparison. After the first programmable delay generation stage, the second inverter, INV2, acts as a voltage comparator to restore the fast clock edge to ensure low phase noise performance. Ideally, a comparator with infinite gain can instantaneously toggle when the input reaches the compactor threshold level. But in practice, the comparator has finite gain and non-zero delay, $t_{d2}(x)$. Comparator delay, $t_{d2}(x)$, can be defined as the time needed for the comparator output to reach next-stage threshold after its input crosses the compactor threshold level $V_T$. Comparator delay $t_{d2}(x)$ is a strong non-linear function of its input waveform or simply its input slope. Because of the slow input slope, INV2 will experience large short-circuit current during the low-to-high output ($V_{O2}$) transition, where NMOS transistor MN2 (FIG. 10) operates in its linear region then in saturation and conducts current $I_{n2}$ before turning off.

Accurate analytical expression of the inverter output waveform directly by solving differential equations describing the temporal evolution of INV2 output can be found in the literature. Because the delay generation process in the first stage results in a variable slope waveform (i.e., $V_{O1}$ has slower slope for higher input code x), changing $C_1(x)$ will also change INV2 delay $t_{d2}(x)$ in a non-linear manner. This behavior becomes the dominant factor as the required DTC delay range increases and will mostly dictate the overall DTC slice INL characteristics compared to other factors affecting $t_{d1}(x)$ discussed earlier. INV2 delay $t_{d2}(x)$, and subsequently DTC total delay $t_{DTC}(x)$, become non-linear sooner as DTC input code x increases. This non-linear dependence can be approximated as $t_{d2} \propto x^{\alpha_{p2}/(\alpha_{p2}+1)}$ using the α-power law MOS model, where $a_{p2}$ is the MP2 velocity saturation index. The resulting INL curve typically has a shape very close to that of DTC INL shown earlier in FIG. 7, where it mostly has even-order characteristics. This shows the substantial improvement by using the differential DTC scheme which inherently suppresses this even-order dominant INL characteristics.

A secondary non-ideal effect is induced by comparator operation related to supply ripples induced by comparator switching. These ripples appear at code-dependent delay instants and can degrade the purity of the main supply voltage. The differential DTC architecture of FIG. 10, where VDD of both DTCR 162 and DTCM 164 are tied tightly together, helps to equalize these ripples. Introducing power supply regulator 212 (FIG. 10) helps to completely isolate the local DTC supply VDD from the global supply $VDD_G$ that is shared between other system blocks to achieve the desired superior phase noise and spurious performance of FN-PLL.

Power supply regulator 212 can also be re-used in the operation of background calibration of DTC gain. This is useful because DTC gain $K_{DTC}$ is sensitive to Process, Voltage, and Temperature (PVT) and aging variations and, if not ensured to be equal to $T_{DCO}/2^N$ as discussed earlier, it will result in imperfect cancellation of ΔΣ truncation error.

FIG. 10 further shows the details of DTC gain calibration loop using Least Mean Square (LMS) technique. LMS DTC gain error signal, $e_{LMS}[k]$ is obtained by correlating (i.e. multiplication) FN-PLL error signal $e_{TDC}[k]$ with ΔΣ truncation error $e_Q[k]$. Quantizers can be optionally used to reduce the bit width of $e_{TDC}[k]$ and/or $e_Q[k]$ to even 1-bit (i.e. sign only) to save power and area and relaxes timing requirements of LMS correlator hardware implementation. $e_{LMS}[k]$ is then accumulated to produce a precise digital gain calibration factor $g_C[k]$.

High resolution digital-to-analog converter (DAC) 214 converts LMS correlator 210 output, $g_C[k]$, to an analog voltage, $V_{REF}$. Using $V_{REF}$ as its reference voltage, a Low Drop Out regulator (LDO) in power supply regulator 212 generates tuned supply voltage VDD for the inverter-based variable-slope DTC of DTCR 162 and DTCM 164. Compared to digital gain scaling, this approach eliminates the need for a power-hungry digital multiplier at the input of the DTC and is better suited for complex non-linearity identification and compensation techniques such as described in U.S. Pat. No. 10,594,329, filed Dec. 7, 2018, entitled "Adaptive Nonlinearity Identification and Compensation Using Orthogonal Functions in a Mixed Signal Circuit", naming Ahmed Elkholy as an inventor, which application is hereby incorporated by reference.

Differential Constant-Slope DTC

In order to eliminate the non-linearity impact of comparator delay in a variable-slope DTC architecture, accurate programmable delay can alternatively be generated using a constant-slope DTC architecture. In a constant-slope DTC architecture, the first delay-generating stage relies on constant current source $I_C$ charging a fixed capacitor $C_C$. To realize variable delay, the input delay control code x can either control comparator threshold voltage $V_T(x)$, or pre-charge capacitor $C_C$ with initial voltage $V_P(x)$ using a highly accurate DAC. The first method increases the design complexity of the comparator. Besides, it has to accommodate a large comparator common-mode range, and its code-dependent common-mode can introduce large non-linearity in the DTC characteristics. The second method offers inherently better linearity performance, as the sensitive comparison operation operates on a constant-slope input signal and a fixed threshold voltage $V_T$. Assuming the dynamic range of initial voltage $V_P(x)$ is properly distanced from $V_T$, the input signal will have the same trajectory through the comparator threshold $V_T$ at any input delay control code x. This ensures almost code-independent comparator delay, hence excellent DTC linearity performance can be achieved, where it is only limited by the pre-charge DAC non-linearity $p_{DAC}(x)$.

Figure 12:
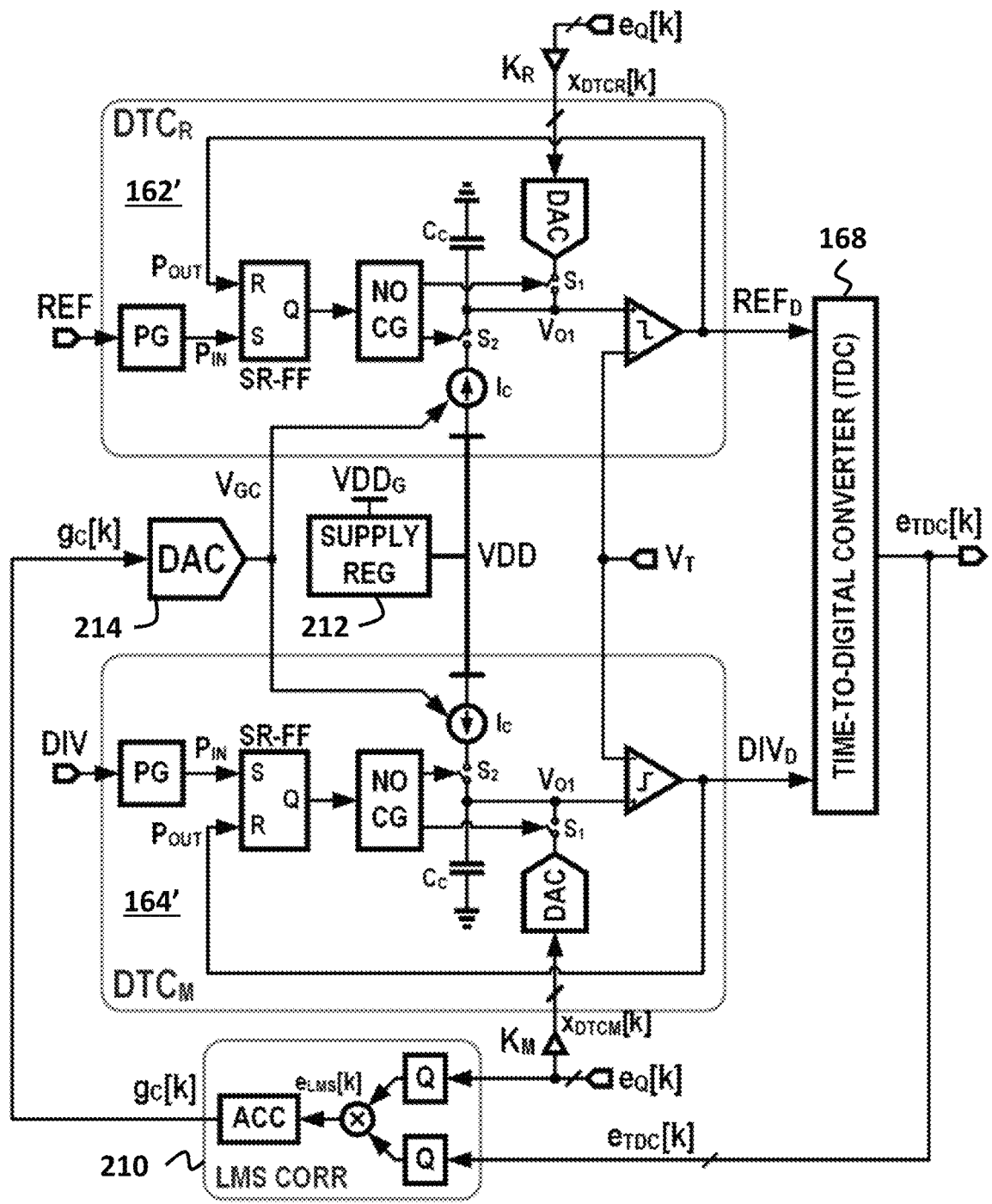
FIG. 12 shows a constant-slope embodiment of the differential DTC.

FIG. 12 shows a constant-slope embodiment of the differential DTC. FIG. 12 can be a subset of either of the PLL's shown in FIGS. 3, 9, receiving input clock REF, feedback clock DIV, accumulated modulation $e_Q[k]$, and generating the digital error value $e_{TDC}[k]$ that can control the digital loop filter and DCO of the PLL.

Identical and perfectly matched DTCR 162' and DTCM 164' are each implemented using constant current source $I_C$ charging a fixed capacitor CC, a highly accurate DAC pre-charging capacitor $C_C$ dynamically with initial voltage $V_P(x)$, and a voltage comparator with static threshold voltage $V_T$. A Pulse Generator (PG), a Set-Reset Flip Flop (SR-FF), and Non-Overlapping Clock Generators (NO-CG) generate non-overlapped clocks controlling switches S1 and S2 based on an input positive clock edge. Switch S1 controls current from the DAC to pre-charge the capacitor $C_C$, and switch S2 controls current from the constant current source $I_C$ to charge capacitor $C_C$. The higher the initial voltage $V_P(x)$, set by the DAC, the lower is the measured output delay $t_{DTC}(x)$, as the constant current source $I_C$ needs to charge capacitor $C_C$ for a smaller duration to reach the threshold voltage $V_T$. TDC 168 feeds the output back through LMS correlator 210 and DAC 214 to control the constant current sources $I_C$ while power supply regulator 212 controls VDD to DTCR 162' and DTCM 164'.

Figure 13:
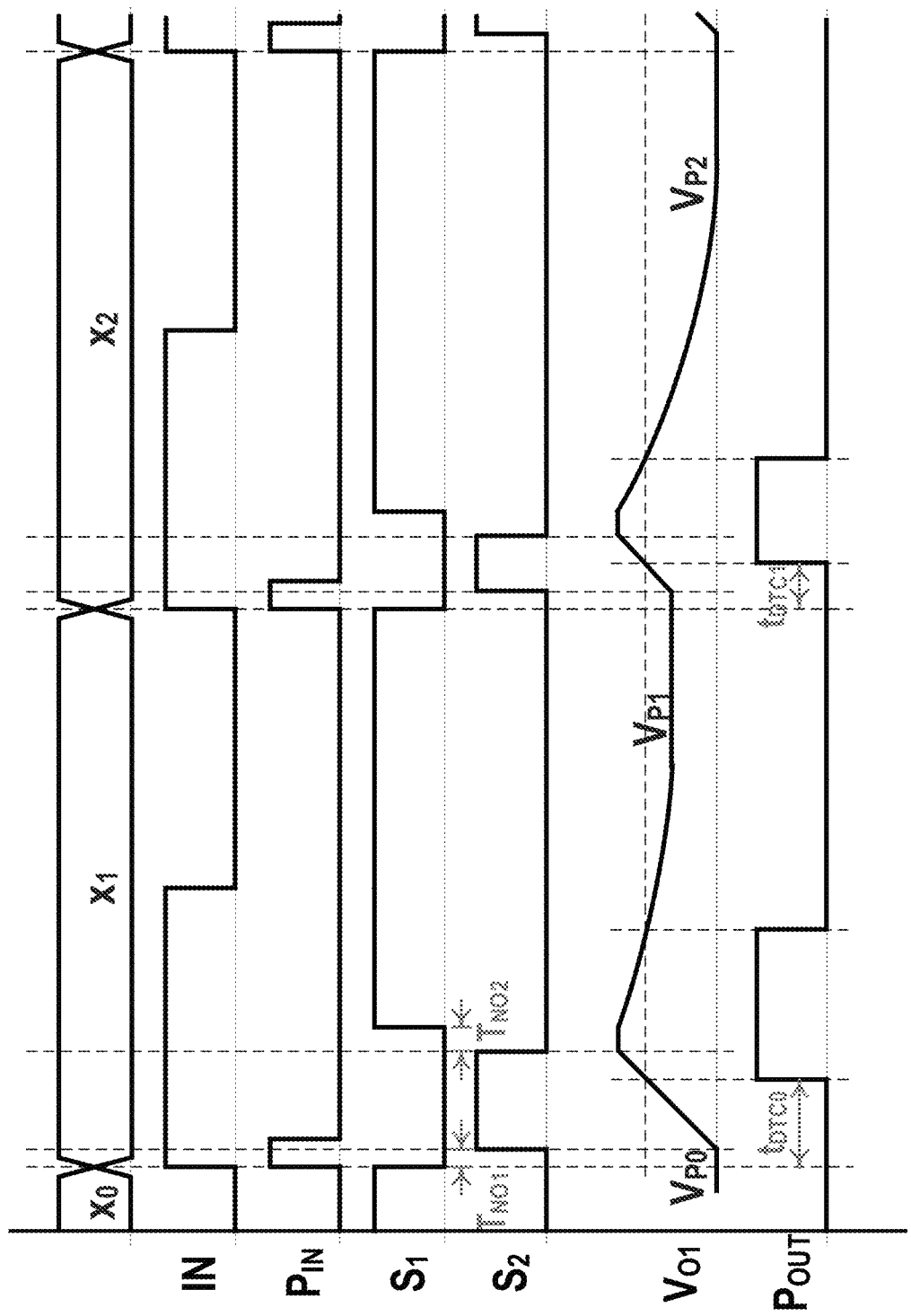
FIG. 13 is a timing diagram illustrating the basic operation of a constant-slope DTC slice, such as DTCR 162' or DTCM 164' in FIG. 12.

FIG. 13 is a timing diagram illustrating the basic operation of a constant-slope DTC slice, such as DTCR 162' or DTCM 164' in FIG. 12. Before the arrival of the input positive clock edge, switch S2 is switched OFF and switch S1 is switched ON, hence capacitor $C_C$ node voltage $V_{O1}$ (comparator input signal) is pre-charged dynamically by the DAC with initial voltage $V_P$ based on the input control code x. When input signal IN (REF or DIV signals in FIG. 12) arrives, S1 is turned OFF, and the DAC is disconnected. After certain delay $T_{NO1}$ defined by NO-CG, S2 is switched ON triggering the current source $I_C$ to start charging $C_C$ starting from the pre-set initial voltage $V_P$. When the ramp voltage signal $V_{O1}$ hits the comparator threshold voltage $V_T$, The DTC slice generates a positive edge at its output POUT. To minimize the wasted charging current after the comparison operation, and to speed up DAC settling for the next cycle, POUT is used as the SR-FF reset control to turn OFF switch S2. After another delay $T_{NO2}$ defined by NO-CG, S1 is switched ON, connecting the DAC output to $V_{O1}$ to set a new initial voltage $V_P(x)$ for the next clock cycle. When $V_{O1}$ falls below $V_T$, the comparator generates a negative edge at the output POUT.

The total delay of a DTC slice, $t_{DTC}(x)$, for an input control word, x can be expressed as:

$$t_{DTC}(x) = t_{d1} + \left(V_T - \frac{(|V_{P0} + K_{DAC}x + p_{DAC}(x)|)}{V_p(x)}\right) \cdot \frac{C_C}{I_C} + t_{d2} \quad (7)$$

where $t_{d1}$ is the sum of low-to-high transition delays of PG, SR-FF, and $T_{NO1}$. Also, $t_{d2}$ is the comparator delay, which is code-independent. Being code-independent is a clear advantage of the constant-slope DTC architecture.

The initial voltage $V_P(x)$ is defined by $V_{P0}$ (DAC offset voltage at x=0), DAC gain $K_{DAC}$ [V/LSB], and DAC Integral Non-Linearity (INL) characteristics $P_{DAC}(x)$. It can be re-written as:

$$t_{DTC}(x) = t_{OS} + K_{DTC} \times p_{DTC}(x) \quad (8)$$

where the overall DTC time offset $t_{OS} = t_{d1} + t_{d2} + (V_T - V_{P0})C_C/I_C$, gain $K_{DTC} = -K_{DAC}C_C/I_C$, and INL $p_{DTC}(x) = -P_{DAC}(x)C_C/I_C$ strongly depends on the DAC characteristics.

Figure 14:
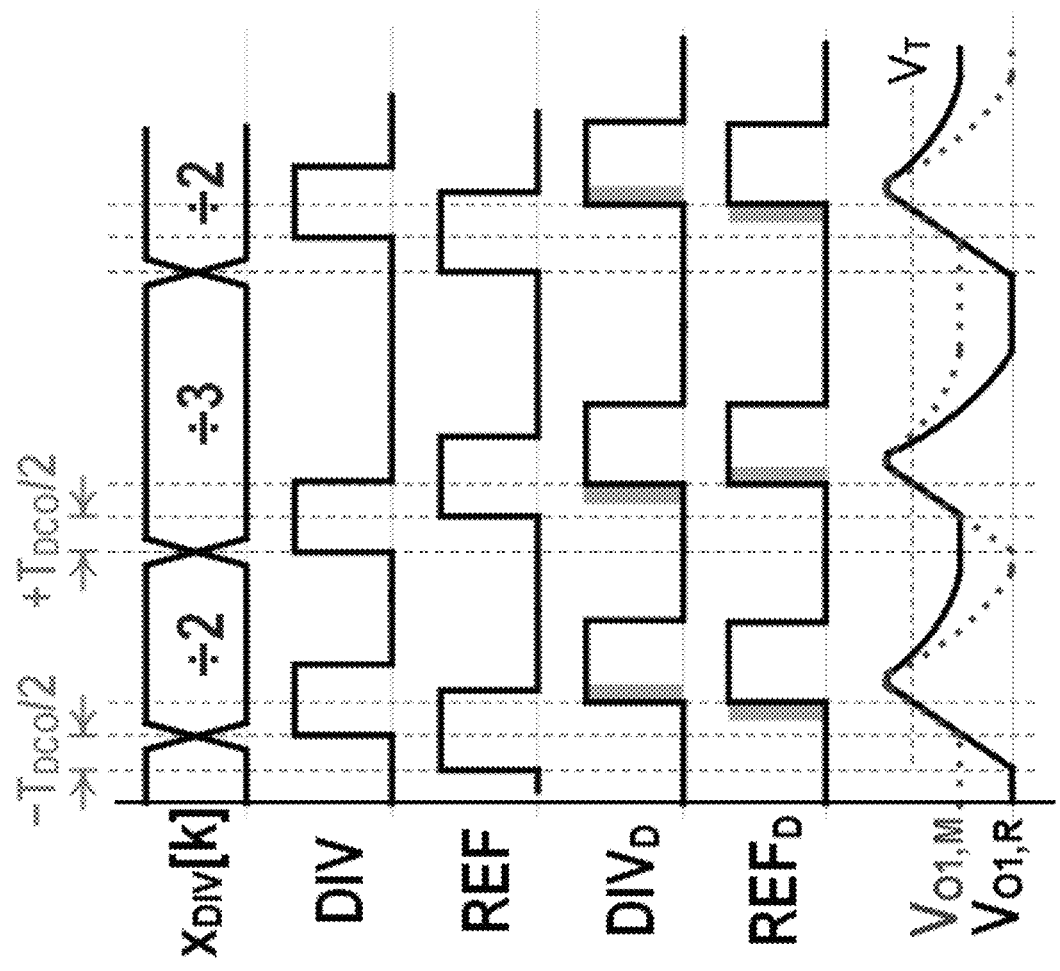
FIG. 14 shows a timing diagram of differential DTC input and output signals in the locked state of a FN-PLL.

FIG. 14 shows a timing diagram of differential DTC input and output signals in the locked state of a FN-PLL. In the example shown in FIG. 14, a first order $\Delta\Sigma$ modulator is used to realize a division ratio of 2.5 ($N_{DIV}$=2 and $\alpha_{DIV}$=0.5). $\Delta\Sigma$ quantization noise appears as a time difference between REF and DIV positive clock edges as +0.25 $T_{DCO}$ in the first cycle, and −0.25 $T_{DCO}$ in the second cycle. This DJ pattern repeats every two cycles.

After the FN-PLL is locked, differential DTC ramp voltages $V_{O1,M}$ and $V_{O1,R}$ cross the comparator threshold $V_T$ at the same time instance, hence the positive edges of outputs REFD and DIVD are aligned, and $\Delta\Sigma$ quantization error is cancelled. As discussed earlier, gain $K_{DTC}$ is sensitive to PVT and aging variations and needs to be calibrated to $T_{DCO}/2^N$. The residual $\Delta\Sigma$ quantization error is detected by the TDC, and the LMS correlator generates an accurate gain calibration factor $g_C[k]$. Because $K_{DTC} = -K_{DAC}C_C/I_C$, it can be calibrated by varying capacitor $C_C$, current source $I_C$, or the DAC reference voltage controlling its gain $K_{DAC}$. One method was shown earlier in FIG. 12, wherein a high-resolution DAC converts $g_C[k]$ to an analog voltage $V_{GC}$ setting the current of a voltage-controlled current source. Other methods can also be used but are not shown, such as using a high-resolution current DAC as $I_C$ or a high-resolution capacitor DAC as $C_C$ driven directly by $g_C[k]$.

Merged Differential DTC and TDC Architecture

Extending PLL bandwidth to achieve the desired superior phase noise and spurious performance can help to realize high-resolution high-linearity low-noise TDC to achieve low in-band phase noise performance. High-resolution high-linearity TDC performance also helps to detect the INL of the wide dynamic range DTC, enabling accurate INL identification and compensation techniques.

Assuming uniform quantization noise power spectral density, PLL in-band phase noise due to TDC quantization noise is estimated as:

$$S_{\Phi,TDC} = \left(\frac{2\pi N_{DIV} \cdot T_{TDC}}{T_{REF}}\right)^2 \cdot \left(\frac{T_{REF}}{12}\right) \quad (9)$$

where $T_{TDC}$ is TDC effective resolution, $T_{REF}$ is REF clock period, and $N_{DIV}$ is PLL multiplication factor. Therefore, to lower the in-band phase noise, $T_{TDC}$ should be minimized. Ideally, $T_{TDC}=1$ ps corresponds to −112 dB/Hz in-band phase noise at 10-GHz output using a clean 50-MHz reference clock. A conventional delay-line based TDC architecture suffers from limited resolution in the range of 10-20 ps even when advanced CMOS technology is used. Moreover, it is typically realized using inverters, which have a poor Power Supply Rejection Ratio (PSRR). Other architectures such as Vernier delay lines, parallel delay lines, and two-step, adopt analog-intensive design approaches with complex calibration schemes to achieve sub-gate delay resolution. As a result, they occupy a large area and consume high power.

Compared to delay-based TDC, Analog-to-Digital Converter (ADC)-based TDC has potentially finer resolution and better linearity performance. Here, the time signal to be measured is converted first to a voltage signal before quantization using a standard ADC. Using a Successive Approximation Register (SAR)-ADC, superior energy efficiency can be achieved. SAR-ADC-based TDC typically relies on a single cyclic-operated voltage comparator, which eliminates active device mismatch of conventional TDCs. Advancement in CMOS technology reduces capacitance mismatch of the capacitor array. Hence, an embodiment with a 10-11 bits SAR-ADC can be very compact and achieve excellent linearity performance.

Figure 15:
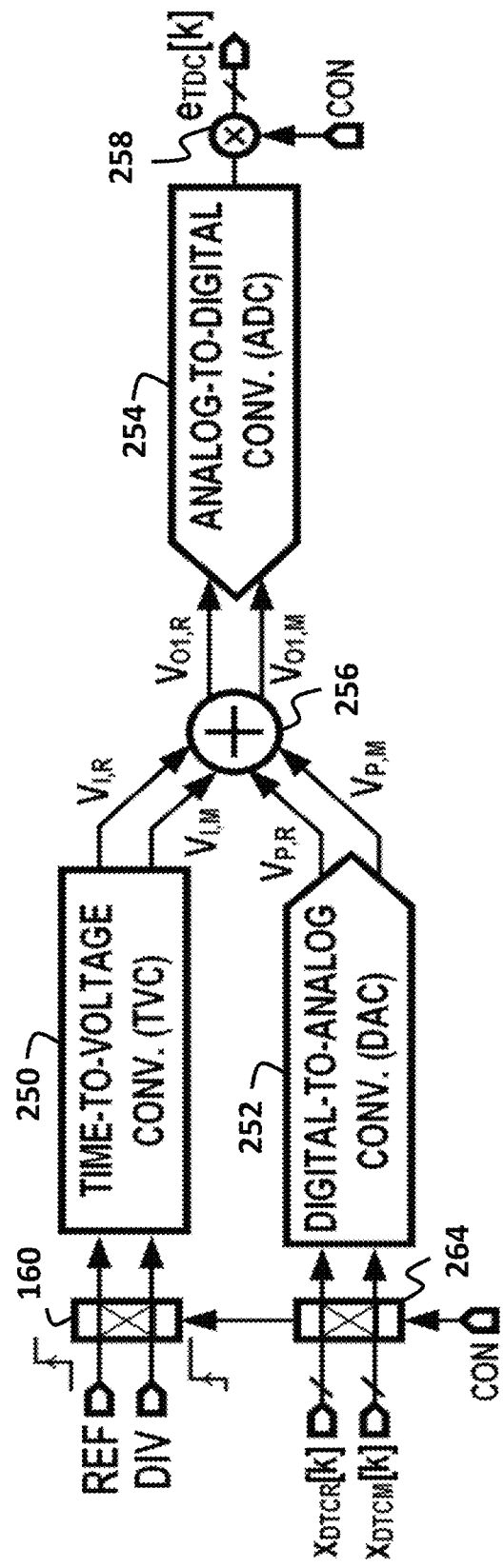
FIG. 15 is a simplified diagram of a merged differential DTC and TDC architecture.

FIG. 15 is a simplified diagram of a merged differential DTC and TDC architecture. DTC and TDC can be combined to optimize the time-domain conversion for fractional frequency synthesis. DTC 162, 164 of FIGS. 3, 9, 10, 12 can be replaced with TVC 250 (TVCR 250R and TVCM 250M of FIG. 16) to convert from the time domain to the voltage domain, rather than from the digital domain to the time domain. ADC 254 replaces TDC 168 of FIGS. 3, 9, 10, 12, converting from the voltage (analog) domain to the digital domain, rather than from the time to the digital domain.

DAC 252 converts differential digital inputs $x_{DTCM}[k]$ and $x_{DTCR}[k]$ into differential initial voltage signals $V_{P,M}$ and to $V_{P,R}$. Time-to-Voltage Converter (TVC) 250 is triggered by REF and DIV clock edges and converts the phases of REF and DIV into differential voltage signals $V_{I,M}$ and $V_{I,R}$ that are added by adder 256 to DAC 252 output voltages to generate signals $V_{O1,M}$ and $V_{O1,R}$ as a differential input of ADC 254.

Compared to the architecture presented in FIG. 12, the voltage-to-time conversion step inside the DTC is removed, and the time-to-voltage conversion inside the ADC-based TDC is removed, hence a very efficient implementation is realized saving considerable amount of power consumption and implementation area. This also greatly enhances the noise performance of the combined DTC and TDC, because of elimination of the added noise from these two major conversion steps that can dominate the overall in-band phase noise performance of the PLL. Control signal CON causes switch networks 160, 264 to flip inputs and multiplier 258 to switch the output of the combined DTC and TDC. Flicker-noise mitigation techniques (i.e. chopping and CDS) discussed earlier can also be applied to CON to switch networks 160, 264 to reduce DTC and TDC flicker noise.

Figure 16:
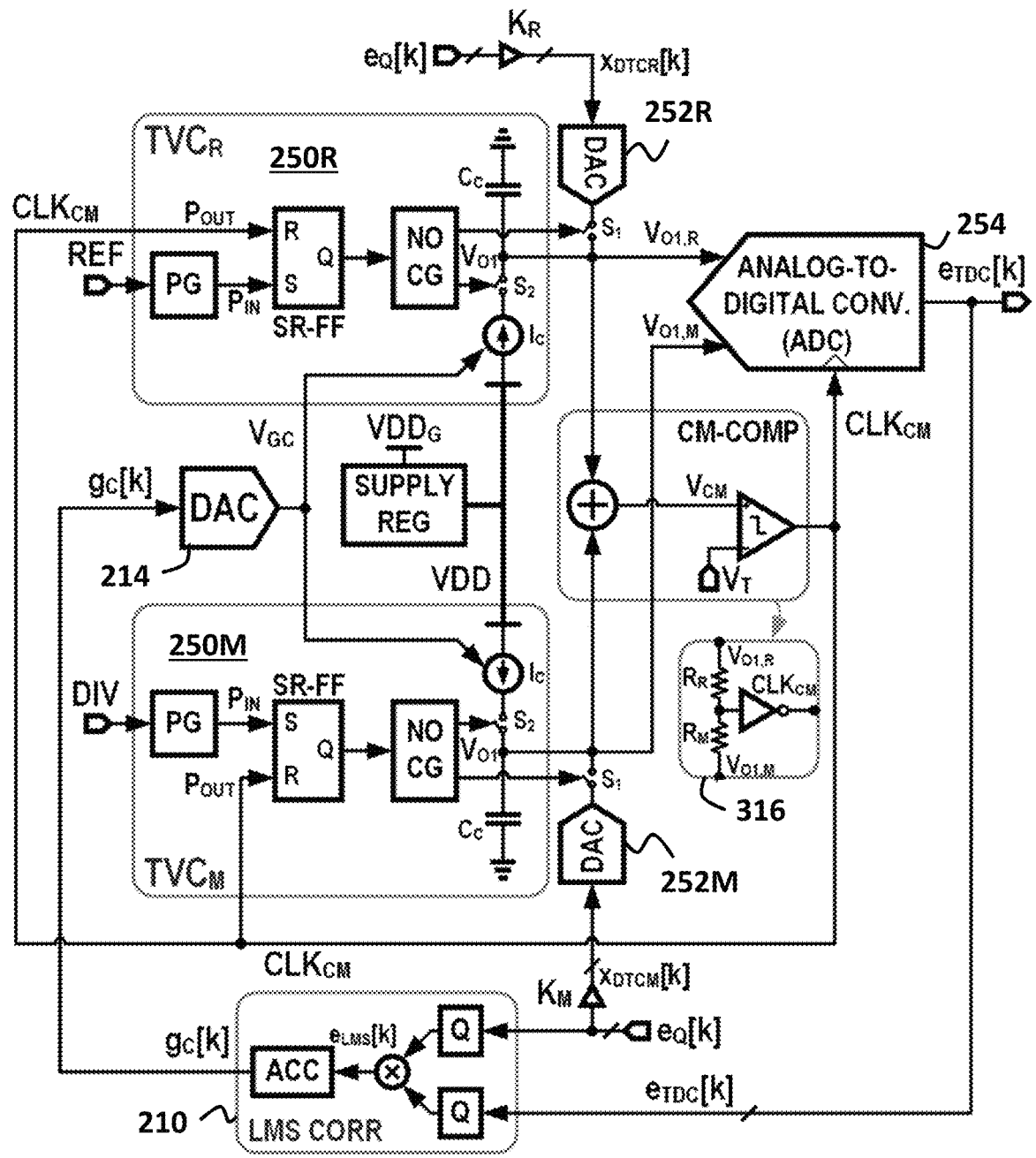
FIG. 16 shows a merged differential DTC and TDC embodiment leveraging the constant-slope technique.

FIG. 16 shows a merged differential DTC and TDC embodiment leveraging the constant-slope technique. FIG. 16 can be a subset of either of the PLL's shown in FIGS. 3, 9, receiving input clock REF, feedback clock DIV, accumulated modulation $e_Q[k]$, but having ADC 254 generate the digital error value $e_{TDC}[k]$ that can control the digital loop filter and DCO of the PLL. FIG. 16 shows a more detailed implementation of the simplified diagram of FIG. 15.

The time-to-voltage conversion in an ADC-based TDC may use a dedicated ramp-voltage generator. Alternatively, the embodiment of FIG. 16 eliminates the two voltage comparators inside the differential constant-slope DTC and re-uses the constant-slope generated inside the DTC slices as ramp voltage generators for the ADC-based TDC. These power-hungry comparators were responsible to regenerate fast REFD and DIVD positive edges, and now ramp voltage signals $V_{O1,M}$ and $V_{O1,R}$ are directly used as differential inputs of ADC 254.

Two Time-to-Voltage Converters (TVC) are used, TVCR 250R and TVCM 250M, that convert from the time domain, such as a clock edge, to the voltage domain, such as an analog voltage that can be a voltage on a capacitor. Identical and perfectly matched TVCR 250R and TVCM 250M are implemented using constant current source $I_C$ charging capacitor $C_C$, highly-accurate DACs 252R, 252M pre-charging capacitors $C_C$ dynamically with initial voltage $V_P(x)$, switches S1 and S2 controlled by clocks generated by PG, SR-FF, and NO-CG as described earlier for FIG. 12. TVCM 250M output signal $V_{O1,M}$ and TVCR 250R output signal $V_{O1,R}$ (ADC 254 differential input signal) are added using a voltage summer to generate a common-mode voltage $V_{CM}=V_{O1,M}+V_{O1,R}$ driving a single voltage comparator. This can be implemented as common-mode generator 316 using two resistors $R_M$ and $R_R$ receiving signals $V_{O1,M}$ and $V_{O1,R}$, and a simple inverter.

Operation is similar to that described earlier in the timing diagram of FIG. 13. For each TVC slice, TVCR 250R and TVCM 250M, before the arrival of its input positive clock edge, S2 is switched OFF and S1 is switched ON. Charging capacitor $C_C$ node voltage $V_{O1}$ (ADC input signal) is pre-charged dynamically by DAC 252R or 252M with initial voltage $V_P$ based on the input control code x. When TVC input signal IN (REF or DIV signals in FIG. 16) arrives, S1 is turned OFF, and DAC 252R or 252M is disconnected. After delay $T_{NO1}$ defined by the NO-CG, S2 is switched ON triggering the current source $I_C$ to start charging $C_C$ from the pre-set initial voltage $V_P$. When the ramp common-mode voltage signal $V_{CM}$ hits comparator threshold voltage $V_T$, the TVC slice generates a positive clock edge CLKCM. ADC 254 uses CLKCM as a clock to sample its input. CLKCM is also used as SR-FF reset control to turn OFF switch S2 both TVCM 250M and TVCR 250R. After another delay $T_{NO2}$ defined by NO-CG allowing enough time for ADC 254 to sample its inputs, S1 is switched ON connecting DAC 252R, 252M output to $V_{O1}$ to set a new initial voltage $V_P(x)$ for the next clock cycle. When $V_{CM}$ falls below $V_T$, the comparator generates a negative edge at the output CLKCM. Then, a generic ADC, or an asynchronous SAR-ADC, performs voltage quantization using a binary-search algorithm and a single voltage comparator allowing the use of a single CLKCM negative clock edge.

SAR-ADC resolution and linearity performance will mostly dictate TDC performance. TDC effective resolution can be calculated using:

$$T_{TDC} = \frac{\Delta V_{ADC}}{dV/dt} = \frac{(V_{max} - V_{min})/2^{M-1}}{dV/dt} \quad (10)$$

where $\Delta V_{ADC}$ is ADC resolution [V/LSB], dV/dt is the slope of the ramp voltage $V_{O1}$, M is ADC 254 number of bits, $V_{max}$ and $V_{min}$ are maximum and minimum single-ended voltages allowed as ADC input. Slope dV/dt is set by the required DTC dynamic range for QNC. For a second order $\Delta\Sigma$ modulator, DTC gain, $K_{DTC}$, has to match DCO period as dictated by: $K_{DTC} T_{DCO}/2^N$. Hence, $$\text{Slope} = \frac{dV}{dT} = \frac{V_{DAC,FS}}{T_{DCO}} \quad (11)$$

where $V_{DAC,FS}$ is output voltage dynamic range of DAC 252R, 252M. For 8 GHz output frequency and 0.25V DAC dynamic range, a slope dV/dt of 2V/ns can be realized. Typically, ADC input range is limited by supply voltage, and may have $V_{max}=1V$, and $V_{max}=0V$. For 10-bit resolution (M=10), a time resolution $T_{TDC}=1\times 2^{-9}/(2\times 10^9) \cong 1$ ps is realized.

This represents an order of magnitude improvement compared to conventional TDCs, but it may not enough to achieve the desired superior in-band phase noise level. Thanks to the differential DTC-based QNC scheme, in steady state operation after the PLL is locked, ADC input signals $V_{O1,M}$ and $V_{O1,R}$ are approximately equal. Hence a fine resolution narrow-range ADC can be leveraged to realize very-fine time resolution. With ±0.1V ADC input range around a common-mode voltage set by common-mode comparator threshold $V_T$, a very fine time resolution of $T_{TDC} \cong 100$ fs and dynamic range of ±51 ps can be achieved. This dynamic range is much larger than the required range (±4 ps) to track PLL noise and detect DTC peak INL, but it helps to considerably reduce the non-linear settling time and speed up the overall PLL settling time.

Because of the complexity to generate accurate reference voltages $V_T \pm 0.1V$ for an ADC, and to reduce kT/C noise contribution during ADC sampling, a Variable Gain Amplifier (VGA) may precede the SAR-ADC for better performance optimization. A high VGA gain setting $G_{VGA}$ helps to effectively improve TDC time resolution in steady state operation. For example, using $G_{VGA}=20$ with ±0.25V ADC input range and 7-bit resolution (M=7), a very fine time resolution of $T_{TDC} \cong 100$ fs is realized. Furthermore, a low VGA gain setting $G_{VGA}=1$ helps to extend TDC dynamic range to ±128 ps during transient to speed up PLL settling.

As discussed earlier, gain $K_{DTC}$ is sensitive to PVT and aging variations and needs to be calibrated to $T_{DCO}/2^N$. ADC 254 output $e_{TDC}[k]$ detects residual $\Delta\Sigma$ quantization error, and LMS correlator 210 generates an accurate gain calibration factor $g_C[k]$. Because $K_{DTC}=-K_{DAC}C_C/I_C$, it can be calibrated by varying capacitor $C_C$, current source $I_C$, or DAC reference voltage controlling its gain $K_{DAC}$. One method is shown in FIG. 16, where high-resolution DAC 214 converts $g_C[k]$ to an analog voltage $V_{GC}$ setting the current of the voltage-controlled current sources. Other methods could use a high-resolution current DAC as $I_C$ or a high-resolution capacitor DAC as $C_C$ driven directly by $g_C[k]$.

Assuming pre-charge DAC 252R, 252M and ADC 254 have accurate gain characteristics, defined by well-controlled reference voltages, calibrating $K_{DTC}$ will also calibrate TDC effective gain. Compared to conventional PVT-sensitive TDC architectures the combined DTC and TDC architecture of FIG. 16 helps reduce PVT and ageing variations of PLL loop gain and bandwidth.

Figure 17:
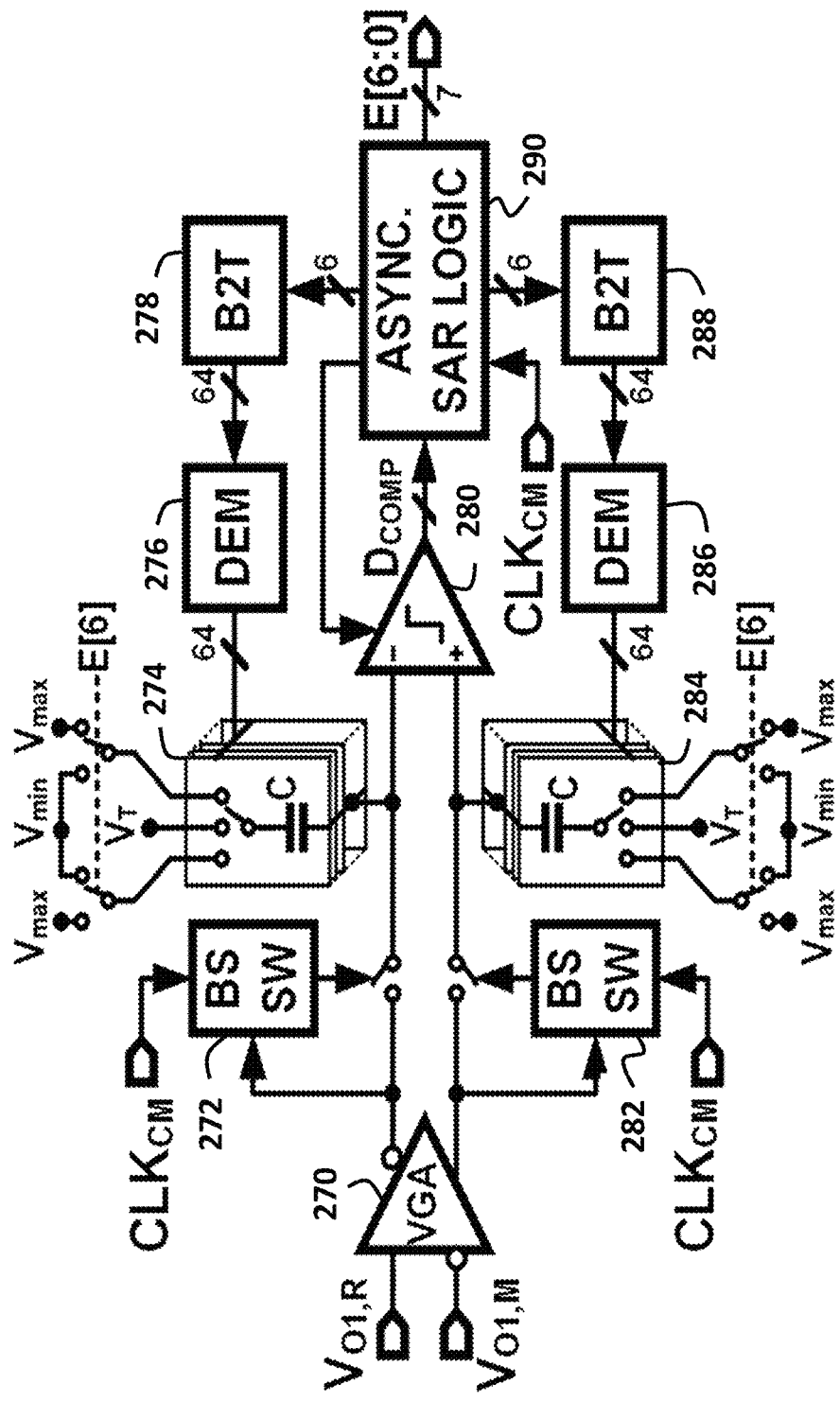
FIG. 17 shows an asynchronous SAR-ADC employing Dynamic Element Matching (DEM) to enhance the associated linearity.

FIG. 17 shows an asynchronous SAR-ADC employing Dynamic Element Matching (DEM) to enhance the associated linearity. ADC 254 (FIG. 16) can be a generic ADC, or can be replaced by the SAR-ADC apparatus of FIG. 17. Because of the complexity to generate accurate reference voltages $V_T \pm 0.1V$ for an ADC, and to reduce kT/C noise contribution during ADC sampling, Variable Gain Amplifier (VGA) 270 precedes the SAR-ADC for better performance optimization.

A differential 7-bit asynchronous SAR-ADC has two switched capacitor DAC arrays 274, 284, two input Sample and Hold (S&H) circuits using bootstrapped switches 272, 282, and a single comparator, comparator 280, driving asynchronous SAR logic 290. Asynchronous control is employed to minimize the power consumption and to allow binary-search algorithm operation using a single sampling clock CLKCM. Top plate sampling is used to reduce the overall capacitance, and a three-level capacitor switching scheme is used to achieve high switching energy efficiency without dropping the common-mode level. Based on the output of the comparator, the feedback loop performs a 7-bit binary-search algorithm to determine the digital output code. For an ADC-based TDC in a PLL, the differential non-linearity (DNL) is more important than the INL performance, because in steady state ADC input signals $V_{O1,M}$ and $V_{O1,R}$ are approximately equal. Hence, a urinary capacitor array can be used with Dynamic Element Matching (DEM) 276, 278 inside the SAR ADC, to limit the differential non-linearity (DNL) to only one capacitor variance. To further enhance SAR-ADC linearity performance, two bootstrapped switches 272, 282 are used to sample the input. Binary-to-Thermometer (B2T) decoders 278, 288 convert the 6-bit binary values from SAR logic 290 to 64-bit thermometer codes for use with DEM 276, 278 to control the two switched capacitor DAC arrays 274, 284.

Alternate Embodiments

Several other embodiments are contemplated by the inventor. For example, many kinds and arrangements of analog detectors, filters, oscillators, adders, DAC's, and digital processors, function units, logic gates, and logic structures are possible. Various encodings, transforms, and alterations to data and signals may be performed at different stages, and for a variety of reasons. Functional units, blocks, and other components may be shared and used for several purposes. Various initialization and start-up procedures or circuits could be added, or power-down circuits and routines.

Identical and perfectly matched TVCR 250R and TVCM 250M, or identical and perfectly matched DTCR 162 and DTCM 164 can produce matching output changes or adjustments when a noise signal is applied to inputs of both TVCR 250R and TVCM 250M, or to both of DTCR 162 and DTCM 164. These matching output adjustments can match within certain precisions, such as matching with 5%, or matching within 1%, etc. Matching DTCR 162 and DTCM 164 can have the same time offset $t_{OS}=t_{OSM}=t_{OSR}$, the same gain $K_{DTC}=K_{DTCM}=K_{DTCR}$, and the same non-linearity coefficients $C_2, C_3, \ldots, C_L$, within 5%, or within 1%, or within some other range of precision. Precisions for some values, such as time offset, may be greater than for other values, such as gain.

Some embodiments disclosed herein are applicable to any ΔΣ FN-PLL, such as analog, digital, or hybrid. FN-PLLs may be used for frequency synthesis, phase modulation and demodulation, clock generation, clock and data recovery, jitter attenuators, and phase synchronization. The output clock OUT may be encoded with data for transmission. Some embodiments presented in this disclosure are particularly suited for applications with stringent phase noise and spurious performance requirements.

Error corrections or adjustments may be added to the loop in the time domain or in the digital domain, or in a combination. Various conversions between domains are possible. Compensation may be performed in time, digital, voltage, or current domains, and in various locations in the PLL or other loop, network, or circuit. The non-linear error may be generated by an m-bit DAC. However, the error may be generated by a DTC (Digital-to-Time Converter) or a PI (Phase Interpolator) where the input signal is in digital form and the output is voltage, time, phase, or other signal form. Generally, similar concepts and techniques can be applied to other analog circuits, such as an ADC (Analog-to-Digital Converter), although modifications may be added because the ADC input signal is analog not digital. ADC 254 can be an asynchronous SAR-ADC or a generic ADC.

A DTC can be any digitally-controlled-delay element, such as a digitally-controlled delay line, a phase rotator, or a phase interpolator. TDC can compare the phases of REF, DIV, CLKCM and generate a multi-bit digital value directly or may use a current source or charge pump to generate an analog voltage that is then converted by and ADC to a digital value.

A Digital-Signal Processor (DSP) may be used for some functions. The DSP may be part of a larger system that is controlled by a Central Processing Unit (CPU) that may have a microprocessor that controls a DSP, signal processing blocks, circuits, or other enhancements such as a pipeline to process signals. The CPU can execute instructions stored in memory to perform the operations. Inputs, outputs, and intermediate results may be stored in one or more memories. Data signals that are converted to digital values may be stored in a memory for processing by a CPU or a DSP, which may use lookup tables or a specialized processor or data pipeline to accumulate values, modulate, perform kernel operations, LMS correlation, compensation function constructor, interpolation, multiplication and addition/subtraction. A general-purpose programmable DSP may be used for prototyping and development, then a faster DSP with dedicated hardware may be used for production. Purpose-built or custom DSP blocks and other hardware may be used for some or all components, while a more generic DSP may be used for other components, especially non-speed-critical blocks. Field-Programmable Gate-Array (FPGA) or other semi-custom blocks may also be used, either initially for prototypes or later for production devices. The invention may also be implemented with an Application-Specific Integrated Circuit (ASIC) design, or other implementations. A mixed-signal or mixed-domain IC may be used that includes the DTC, TVC, PLL, or DSP blocks for gain calibration and compensation. The device may be digitally re-programmable, such as to support various modes of operation, initialization, testing, different bit widths of digital signals, different operating speeds, clock speeds, division factors for the feedback divider, etc.

Many embodiments of the techniques described herein are applicable in general to many Integrated Circuit (IC) building blocks and analog/mixed-signal/RF IC blocks including but not limited to clock generators, Clock and Data Recovery (CDR), phase interpolators, voltage/current amplifiers, Transimpedance Amplifiers (TIAs), and Power Amplifiers (PAs).

Additional components may be added at various nodes, such as resistors, capacitors, inductors, transistors, extra buffering, etc., and parasitic components may also be present. Enabling and disabling the circuit could be accomplished with additional transistors or in other ways. Pass-gate transistors or transmission gates could be added for isolation. Filters may be added.

Currents may be negative currents or positive currents, and capacitors can be charged to higher or lower voltages, and precharged high or low. Terms such as positive, negative, up, down, higher, lower, etc. are relative and may be interchangeable.

Coefficients can be set adaptively or non-adaptively. The coefficients can be set using pre-set values either under manual or computer or program control. At other times the coefficients may be adaptively generated using the LMS correlator. The LMS correlator can be used only on startup and later turned off after the residual error is below a certain threshold or after a pre-set period. The LMS correlator can be turned on again after a pre-determined period of time has elapsed to track Temperature and Supply Voltage variations. The LMS correlator may be turned on again after the residual error is above certain threshold. Thus, adaptive coefficient generation can be used only on startup, or when the residual error is large, with the coefficients stored in a lookup table remaining unchanged when the LMS correlator is turned off.

Some PLL blocks could be implemented in the digital domain or in the analog domain or in the time domain. For example, in FIG. 3, loop filter 170 has been described as a digital-domain block. Loop filter 170 receives a multi-bit digital value for the phase error $e_{TDC}[k]$, and generates a digital control value $D_C[k]$ to control the frequency of oscillation of DCO 174. OUT, DIV, and REF are clocks having phase information indicated by the relative phase offsets to their rising clock edges. However, TDC 168, digital loop filter 170, and DCO 174 could be replaced with their analog-domain equivalents, such as a Phase-Frequency-Detector and Charge Pump, a loop filter such as a capacitor that generates an analog control voltage to control a VCO. The digital value for the gain adjustment from gain calibrator 166 could be converted to analog values and added by one or more adders. A time-domain error at the input to the loop filter or at another location could be converted to a digital value of phase error $e_{TDC}[k]$.

In another alternative, a charge pump and an Analog-to-Digital Converter (ADC) are used, such as in FIG. 16. In this alternative, TVC 250R, 250M measure the time or phase difference between rising edges of clocks REF, DIV, and CLKCM, and activates the charge pump to charge or discharge a capacitor. Then the capacitor voltage is converted by the ADC to a digital value that is input to a loop filter, or an adder.

In still another embodiment, the TDC or TVC could be PFD/CP without a capacitor or ADC. Then the loop filter could be an analog capacitor with an ADC that converts the capacitor voltage $V_C$ to digital control value $D_C[k]$ to control the frequency of oscillation of DCO 174. Other combinations and variations are possible.

While Least-Mean Square (LMS) has been described, other steepest-gradient methods may be substituted, such as Recursive Least squares (RLS), and modifications of LMS, RLS, or other methods.

The techniques described may be applied for different types, architectures, and orders of delta sigma (ΔΣ) modulators.

The + and − inputs to an adder or comparator may be reversed. Inputs to differential blocks may be reversed and outputs inverted. Flip-Flops may be clocked and have 2 stages, or may be a single-stage latch or other bistable.

The background of the invention section may contain background information about the problem or environment of the invention rather than describe prior art by others. Thus, inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A mixed-domain circuit comprising:
a first converter having a first input in a first domain, for generating a first output in a second domain;
a second converter having a second input in the first domain, for generating a second output in the second domain;
wherein the first domain is selected from the group consisting of a time domain, and a digital domain;
wherein the second domain is selected from the group consisting of a time domain, a digital domain, and a voltage domain;
wherein the first converter is matched to the second converter, wherein a signal injected to both the first input and to the second input adjusts the first output and adjusts the second output by a substantially same amount when a same adjustment signal is applied to both the first converter and to the second converter;
wherein the second domain and the first domain are different domains;
a differential converter that receives the first output from the first converter, and that receives the second output from the second converter, for generating an error signal from a difference between the first output and the second output;
wherein the error signal is a signal in the digital domain;
an error compensator that receives the error signal and generates a compensation signal to the first converter and to the second converter, the compensation signal adjusting the first converter and adjusting the second converter to reduce errors generated by the first converter and generated by the second converter.

2. The mixed-domain circuit of claim 1 further comprising:
an input clock applied as the first input to the first converter;
a feedback clock applied to the second input of the second converter;
wherein the error signal generated by the differential converter is filtered to control an oscillator that generates an oscillator clock, wherein the feedback clock is generated by dividing the oscillator clock.

3. The mixed-domain circuit of claim 2 wherein the first domain is the digital domain and the second domain is the time domain;
wherein the first converter and the second converter each comprise a Digital-to-Time Converter (DTC) and the differential converter is a Time-to-Digital Converter (TDC)
wherein the first converter and the second converter are matched to have matching time offset, gain, and non-linearity coefficients that match within 5%, when the same adjustment signal is applied to both the first converter and to the second converter.

4. The mixed-domain circuit of claim 3 further comprising:
a delta-sigma modulator that receives a modulation control word and generates a modulated divisor;
an adder that combines the modulation control word and the modulated divisor to generate a modulated difference;
an accumulator that accumulates the modulated difference to generate an accumulated modulation;
wherein the error compensator further receives the accumulated modulation.

5. The mixed-domain circuit of claim 4 wherein the error compensator further comprises:
a Least-Mean Square (LMS) correlator that correlates the error signal to the accumulated modulation to generate a correlator output.

6. The mixed-domain circuit of claim 4 wherein the error compensator is a gain calibrator that generates a gain control that adjusts a gain of the first converter and of the second converter in response to the error signal and the accumulated modulation.

7. The mixed-domain circuit of claim 6 further comprising:
a multi-modulus divider that receives the modulated divisor from the delta-sigma modulator, the multi-modulus divider generating the second input to the second converter by dividing a clock by the modulated divisor.

8. The mixed-domain circuit of claim 7 further comprising:
an input clock applied as the first input to the first converter;

a loop filter that receives the error signal from the differential converter to generate a digital control signal;

a Digitally-Controlled Oscillator (DCO) that generates a DCO clock having a frequency controlled by the digital control signal from the loop filter;

wherein the clock to the multi-modulus divider is the DCO clock;

wherein the DCO clock is applied to the second converter as the second input;

wherein the DCO clock is also a generated clock output for clocking downstream sub-systems, wherein the mixed domain circuit is a Fractional-N Phase-Locked Loop (FN-PLL).

9. The mixed-domain circuit of claim 8 further comprising:

a switch network for swapping the first input to the first converter with the second input to the second converter in response to a swap signal;

a first inverter for inverting the error signal in response to the swap signal;

a second switch network for swapping scaled values of the accumulated modulation in response to the swap signal.

10. The mixed-domain circuit of claim 7 wherein the clock to the multi-modulus divider is an input clock;

further comprising:

a loop filter that receives the error signal from the differential converter to generate a digital control signal;

a Digitally-Controlled Oscillator (DCO) that generates a DCO clock having a frequency controlled by the digital control signal from the loop filter;

wherein the DCO clock is applied to the second converter as the second input;

wherein the first output from the first converter is also a generated clock output for clocking downstream sub-systems;

wherein the mixed domain circuit is a Fractional-N divider with the generated clock output from an internal node that is the first output from the first converter.

11. The mixed-domain circuit of claim 3 wherein the first converter and the second converter each comprise:

a first inverter responsive to an input of the converter and having an output driving a charging node;

a variable capacitor on the charging node, the variable capacitor having a capacitance value adjusted by the accumulated modulation;

a second inverter having the charging node as an input, and having an output node;

wherein an output of the converter is responsive to the output node of the second inverter;

wherein the input of the converter is the first input for the first converter and the second input for the second converter;

wherein the output of the converter is the first output for the first converter and the second output for the second converter;

wherein the error compensator further comprises:

a correlator Digital-to-Analog Converter (DAC) that generates an analog correlation voltage in response to the correlator output;

a supply regulator that regulates a power-supply voltage or a current-source to the first converter and to the second converter in response to the analog correlation voltage from the correlator DAC.

12. The mixed-domain circuit of claim 3 wherein the first converter and the second converter each comprise:

a bistable that is set by an input to the converter and cleared by a reset signal;

a first switch responsive to a first switch signal;

a second switch responsive to a second switch signal;

a non-overlapping clock generator, responsive to an output from the bistable, for generating the first switch signal and the second switch signal that are non-overlapping so that the first switch and the second switch are not both closed at a same time;

a charging capacitor on a charging node;

a current source that charges the charging capacitor through the second switch in response to the second switch signal;

a precharging DAC that precharges the charging node through the first switch in response to the first switch signal, the precharging DAC precharging the charging node to a preset voltage that is adjusted by the accumulated modulation;

an output comparator that compares a voltage of the charging node to a threshold voltage to generate an output of the converter;

wherein the reset signal to the bistable is responsive to the output of the converter;

wherein the input of the converter is the first input for the first converter and the second input for the second converter;

wherein the output of the converter is the first output for the first converter and the second output for the second converter.

13. The mixed-domain circuit of claim 2 wherein the first domain is the time domain and the second domain is the voltage domain;

wherein the first converter and the second converter each comprise a Time-to-Voltage Converter (TVC) and a Digital-to-Analog Converter (DAC) that are connected together by a charging node;

wherein the differential converter comprises an Analog-to-Digital Converter (ADC) that receives the charging node of the first converter as the first output, and receives the charging node of the second converter as the second output.

14. The mixed-domain circuit of claim 13 wherein the first converter and the second converter each comprise:

a bistable that is set by an input to the converter and cleared by a reset signal;

a first switch responsive to a first switch signal;

a second switch responsive to a second switch signal;

a non-overlapping clock generator, responsive to an output from the bistable, for generating the first switch signal and the second switch signal that are non-overlapping so that the first switch and the second switch are not both closed at a same time;

a charging capacitor on a charging node;

a current source that charges the charging capacitor through the second switch in response to the second switch signal;

a scaler that scales the accumulated modulation to generate a scaled accumulated modulation;

wherein the DAC is a precharging DAC that precharges the charging node through the first switch in response to the first switch signal, the precharging DAC precharging the charging node to a preset voltage that is adjusted by the scaled accumulated modulation;

wherein the input of the converter is the first input for the first converter and the second input for the second converter;

wherein the output of the converter is the first output for the first converter and the second output for the second converter.

15. The mixed-domain circuit of claim 14 further comprising:
a correlator Digital-to-Analog Converter (DAC) that generates an analog correlation voltage in response to the correlator output;
wherein the analog correlation voltage regulates the current source in the first converter and in the second converter in response to the correlator DAC;
a common-mode clock generator that receives the charging node of the first converter and the charging node of the second converter to generate a common-mode clock;
wherein the reset signal to the bistable is responsive to the common-mode clock;
wherein the ADC further comprises a Successive-Approximation Register (SAR) Digital-to-Analog Converter (DAC).

16. A mixed-domain system circuit comprising:
a first Digital-to-Time Converter (DTC) that receives an input clock and a first adjustment value and generates a first output clock having a time delay that is adjusted by the first adjustment value;
a second Digital-to-Time Converter (DTC) that receives a feedback clock and a second adjustment value and generates a second output clock having a time delay that is adjusted by the second adjustment value;
wherein the first DTC and the second DTC are matched to have matching time offset, gain, and non-linearity coefficients that match within 5% when the first adjustment value matches the second adjustment value; a Time-to-Digital Converter (TDC) that receives the first output clock and the second output clock and generates a digital error value;
a digital loop filter that filters the digital error value to generate a digital control value;
a Digitally-Controlled Oscillator (DCO) that generates an output clock having a frequency controlled by the digital control value from the digital loop filter;
a Multi-Modulus Divider (MMD) that divides the output clock by a modulation factor to generate the feedback clock to the second DTC;
a delta-sigma modulator that receives a modulation control word and generates the modulation factor to the MMD;
an adder that combines the modulation control word and the modulation factor to generate a modulated difference;
an accumulator that accumulates the modulated difference to generate an accumulated modulation;
a first scaler that scales the accumulated modulation to generate the first adjustment value to the first DTC; and
a second scaler that scales the accumulated modulation to generate the second adjustment value to the second DTC.

17. The mixed-domain system circuit of claim 16 wherein the first DTC further comprises:
a first capacitor having a first charging time that is adjusted by the first adjustment value;
wherein the first output clock is delayed by the first charging time;

wherein the second DTC further comprises:
a second capacitor having a second charging time that is adjusted by the second adjustment value;
wherein the second output clock is delayed by the second charging time.

18. The mixed-domain system circuit of claim 17 further comprising:
a Least-Mean Square (LMS) correlator that correlates the digital error value to the accumulated modulation to generate a correlator output;
a correlator Digital-to-Analog Converter (DAC) that generates an analog correlation voltage in response to the correlator output;
a supply regulator that regulates a power-supply voltage or a current-source to the first DTC and to the second DTC in response to the analog correlation voltage from the correlator DAC.

19. A mixed-signal circuit comprising:
a first Time-to-Voltage Converter (TVC) that receives an input clock that initiates charging of a first capacitor to generate a first analog voltage;
a second Time-to-Voltage Converter (TVC) that receives a feedback clock that initiates charging of a second capacitor to generate a second analog voltage;
wherein the first TVC and the second TVC are matched to have matching time offset, gain, and non-linearity coefficients that match within 5%;
an Analog-to-Digital Converter (ADC) that receives the first analog voltage and the second analog voltage and generates a digital error value in response to a difference between the first analog voltage and the second analog voltage;
a Least-Mean Square (LMS) correlator that correlates the digital error value to an accumulated modulation to generate a correlator output;
a correlator Digital-to-Analog Converter (DAC) that generates an analog correlation voltage in response to the correlator output;
a first current source in the first TVC, the first current source charging the first capacitor with a first current that is adjusted by the analog correlation voltage; and
a second current source in the first TVC, the second current source charging the second capacitor with a second current that is adjusted by the analog correlation voltage.

20. The mixed-signal circuit of claim 19 further comprising:
a common-mode clock generator that receives the first analog voltage and the second analog voltage to generate a reset signal that ends charging of the first capacitor and of the second capacitor;
a first precharging DAC that precharges the first capacitor, the first precharging DAC precharging the first capacitor to a preset voltage that is adjusted by a first scaled accumulated modulation;
a second precharging DAC that precharges the second capacitor, the second precharging DAC precharging the second capacitor to a preset voltage that is adjusted by a second scaled accumulated modulation;
a first scaler that scales the accumulated modulation to generate the first scaled accumulated modulation to the first precharging DAC; and
a second scaler that scales the accumulated modulation to generate the second scaled accumulated modulation to the second precharging DAC.

* * * * *